(12) United States Patent
Jeloka et al.

(10) Patent No.: US 9,396,795 B1
(45) Date of Patent: Jul. 19, 2016

(54) STORAGE DEVICE SUPPORTING LOGICAL OPERATIONS, METHODS AND STORAGE MEDIUM

(71) Applicant: The Regents of the University of Michigan, Ann Arbor, MI (US)

(72) Inventors: Supreet Jeloka, Ann Arbor, MI (US); David Theodore Blaauw, Ann Arbor, MI (US)

(73) Assignee: The Regents of the University of Michigan, Ann Arbor, MI (US)

( * ) Notice: Subject to any disclaimer, the term of this patent is extended or adjusted under 35 U.S.C. 154(b) by 0 days.

(21) Appl. No.: 14/586,076

(22) Filed: Dec. 30, 2014

(51) Int. Cl.
*G11C 15/04* (2006.01)
*G11C 11/419* (2006.01)

(52) U.S. Cl.
CPC ............ *G11C 15/043* (2013.01); *G11C 11/419* (2013.01); *G11C 15/04* (2013.01)

(58) Field of Classification Search
CPC ..... G11C 11/419; G11C 15/043; G11C 15/04
See application file for complete search history.

(56) References Cited

U.S. PATENT DOCUMENTS

| | | | | |
|---|---|---|---|---|
| 6,310,880 B1* | 10/2001 | Waller | .................. | G11C 15/043 365/189.07 |
| 6,836,419 B2* | 12/2004 | Loughmiller | .......... | G11C 15/04 365/149 |
| 8,848,412 B1* | 9/2014 | Yeung | .................... | G11C 15/04 365/49.1 |
| 2005/0018463 A1* | 1/2005 | Patel | .................... | G11C 15/043 365/49.17 |

OTHER PUBLICATIONS

Arsovski, I. et al., "A Ternary Content-Addressable Memory (TCAM) Based on 4T Static Storage and Including a Current-Race Sensing Scheme", IEEE Journal of Solid-State Circuits, vol. 38, No. 1, pp. 155-158, (Jan. 2003), 4 pages.
Jain, P. et al., "Intelligent SRAM (ISRAM) for Improved Embedded System Performance", CSAIL, Proceedings of the $40_{th}$ Design Automation Conference, Memo 459, (Jun. 2003), 9 pages.
Mai, K. et al., "Architecture and Circuit Techniques for a Reconfigurable Memory Block", IEEE International Solid-State Circuits Conference, Dig. Tech Papers, (Feb. 2004), 10 pages.
Pagiamtzis, K. et al., "Content-Addressable Memory (CAM) Circuits and Architectures: A Tutorial and Survey", IEEE Journal of Solid-State Circuits, vol. 41, No. 3, pp. 712-727, (Mar. 2006), 16 pages.
Patterson, D. et al., "A Case for Intelligent RAM: IRAM", IEEE Micro, (Apr. 1997), 23 pages.

* cited by examiner

*Primary Examiner* — Richard Elms
*Assistant Examiner* — Ajay Ojha
(74) *Attorney, Agent, or Firm* — Pramudji Law Group PLLC; Ari Pramudji

(57) ABSTRACT

A storage device has a plurality of storage cells for storing data values. Control circuitry is provided to simultaneously couple at least two cells to at least one common signal line. Sensing circuitry is provided to sense a signal on the at least one common signal line, which indicates a result of a logical operation applied to the data values stored in each of the at least two storage cells. This allows logic operations such as AND, OR, XOR, etc. to be performed within a storage device so that it is not necessary to read out each data value independently and transfer each data value to a separate processing circuit in order to find the result of the logical operation. This helps to improve performance within a data processing apparatus having the storage device.

19 Claims, 14 Drawing Sheets

STORAGE DEVICE SUPPORTING LOGICAL OPERATIONS, METHODS AND STORAGE MEDIUM

BACKGROUND

1. Technical Field

The present technique relates to the field of storage devices.

2. Technical Background

A data processing apparatus may have a storage device for storing data. For example the storage device may comprise a memory or cache. Data values may be read from the storage device and sent to a processor for processing and the result of processing operations may then be written back to the memory.

Some kinds of storage device identify the data values to be read or written using an address, which is decoded by an address decoder to select the storage cells to be read or written. However, in other types of storage device, known as a content addressable memory (CAM), a data value may be provided to the storage device as a search key and the storage device then compares the search key against each data word stored in the content addressable memory, and returns a match indication if one of the stored data words matches the search key.

SUMMARY

Viewed from one aspect, the present technique provides a storage device comprising:

a plurality of storage cells to store data values;

control circuitry to simultaneously couple at least two storage cells to at least one common signal line; and sensing circuitry to sense a signal level on at least one of said at least one common signal line which is indicative of a result of a logical operation applied to the data values stored in each of said at least two storage cells.

Viewed from another aspect, the present technique provides a storage device comprising:

a plurality of storage cell means for storing data values;

control means for simultaneously coupling at least two storage cells to at least one common signal line; and sensing means for sensing a signal level on at least one of said at least one common signal line which is indicative of a result of a logical operation applied to the data values stored in each of said at least two storage cells.

Viewed from a further aspect, the present technique provides a method comprising:

simultaneously coupling at least two storage cells of a storage device to at least one common signal line; and sensing a signal level on at least one of said at least one common signal line which is indicative of a result of a logical operation applied to data values stored in each of said at least two storage cells.

Viewed from another aspect, the present technique provides a data processing apparatus comprising the storage device.

Viewed from another aspect, the present technique provides a computer readable storage medium storing a memory compiler computer program for controlling a computer to generate an instance of a memory device from a memory architecture associated with the memory compiler computer program, the memory architecture specifying a definition of circuit elements and data defining rules for combining those circuit elements, such that said instance generated specifies a memory device comprising the storage device described above.

Further aspects, features and advantages of the present technique will be apparent from the following description of examples, which is to be read in conjunction with the accompanying drawings.

DESCRIPTION OF EXAMPLES

Figure 1:
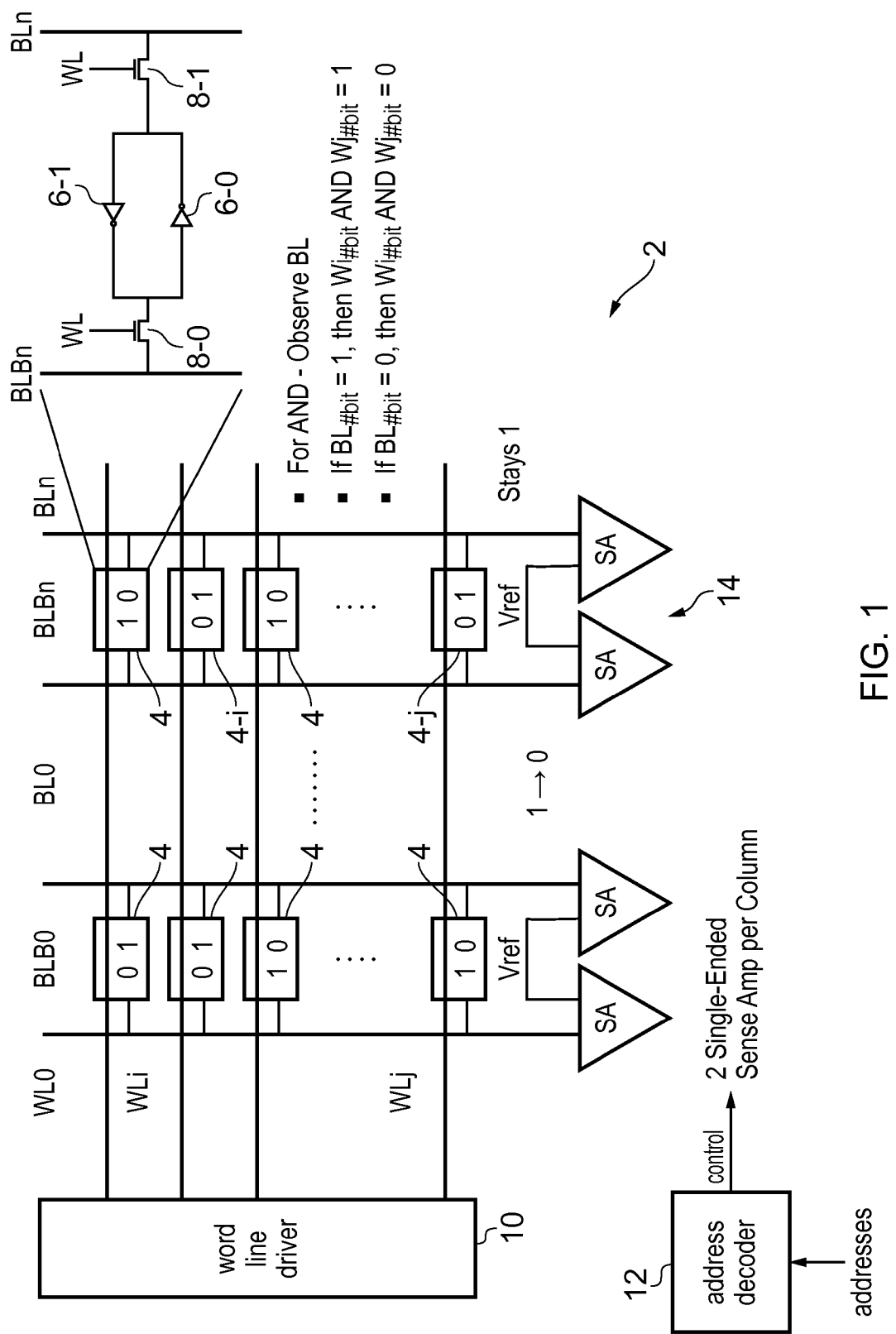
FIG. 1 schematically illustrates an example of determining a result of an AND operation within a storage device.

FIG. 1 shows an example of a storage device 2 having an array of storage cells 4 which are arranged in rows and columns, with each storage cell 4 at the intersection of a wordline WL for the corresponding row and a pair of bitlines BL, BLB for the corresponding column. As shown in the top right of FIG. 1, each storage cell comprises a 6T SRAM (six-transistor static random access memory) cell comprising a pair of cross-coupled inverters 6-0, 6-1 and two access transistors 8-0, 8-1 for coupling the cross-coupled inverters to the respective bitlines BL, BLB in response to signals applied to the wordline WL. Other embodiments may use storage cells other than a 6T SRAM cell. However, using 6T SRAM cells may help to reduce circuit area.

As shown in FIG. 1, the storage device has a wordline driver 10 (which is an example of control circuitry) for controlling signals asserted on the wordlines WL for the respective rows of cells 4, and an address decoder 12 for receiving one or more addresses identifying data values stored in the memory array and controlling the wordline driver 10 to assert wordline signals corresponding to the cells storing the data values. Also, each column of cells has a corresponding sense amplifier 14 for sensing the signals on the bitlines BL, BLB for that column, and a bitline driver (not illustrated in FIG. 1 for conciseness) for driving signals on the bitlines BL, BLB during a write operation. During a read operation, the sense amplifier 14 operates in a differential sensing mode in which the sense amplifier senses a difference between the pair of bitlines BL, BLB for a particular column. However, the sense amplifier 14 also supports a single-ended sensing mode in which the sense amplifier 14 independently compares the signal level on each of the pair of bitlines BL, BLB against a reference voltage Vref. The sense amplifier is described in more detail with respect to FIG. 3 below.

For a read operation to read a data value from a selected storage cell 4, an address identifying that cell is provided to the address decoder 12. The address decoder 12 controls the sense amplifier 14 to precharge the bitlines BL, BLB high for the column containing the selected storage cell 4. Also, the wordline driver 10 asserts the wordline WL of the row including the selected storage cell. This turns on the access transistors 8 for the selected cell, coupling the cross-coupled inverters 6 to the corresponding bitlines, BL, BLB. Depending on the current state of the storage cell, one of the pair of bitlines BL, BLB will drop to 0 and the other will stay at its precharged state of 1. The sense amplifier 14 in differential sensing mode detects which bitline drops to zero and outputs a signal accordingly to indicate the state of the selected cell. In this example, if the BL bitline drops to 0 and BLB stays at 1, then this indicates that the cell represents logical 0, while if the BL bitline stays at 1 and BLB drops to 0, then this indicates that the cell represents logical 1 (i.e. the BL bitline represents the binary state of the cell). However, it will be appreciated that other examples could use the opposite mapping.

For a write operation, the bitlines for a selected column are driven with signals selected based on the bit value to be written. In this example, when writing logical 1 to a cell, bitline BL is driven high and bitline BLB driven low, and for writing logical 0, bitline BL is driven low and bitline BLB drive high (again, this could be the other way round in other embodiments). The wordline driver 10 asserts the wordline for the selected storage cell 4 so that the access transistors 8 turn on to couple the cross coupled inverters 6 to the bitlines so that the latch formed by the inverter 6 is set to the state corresponding to the signals on the bitlines BL, BLB.

While the above paragraphs describe reading or writing a single storage cell, it is also possible to read or write bit values from a number of cells in the same row by sensing the read signals on the bitlines in multiple columns or driving write signals on the bitlines in multiple columns while the wordline for that row is asserted.

The storage device 2 also supports performing a logical operation (or 'compute operation') on the data values stored in at least two of the storage cells within the same column of the storage device 2. For example, FIG. 1 shows an example of performing an AND operation. When performing logical operations within the storage device, the sense amplifier 14 for the selected column operates in the single-ended sensing mode. The address decoder 12 receives two or more addresses identifying storage cells within the same column to which the operation is applied. For example in this example the addresses are for cells 4-$i$, 4-$j$ in column n. The bitlines BLn, BLBn for column n are precharged high, and the wordline driver 10 asserts the wordlines WLi, WLj for the rows containing the selected cells 4-$i$, 4-$j$. This turns on the access transistors 8 for cells 4-$i$, 4-$j$ so that the cross-coupled inverters 6 of these cells are coupled to the bitlines BLn, BLBn for the corresponding column. The sense amplifier 14 for column n then detects the signal level on bitline BLn, which represents the result of performing an AND operation on the bit values stored in cells 4-$i$ and 4-$j$.

That is, in this example, a storage cell is considered to represent a bit value of 1 if the output of inverter 6-0 is 1 and the output of inverter 6-1 is 0. Therefore, if both cells 4-$i$, 4-$j$ are in the '1' bit state (i.e. the result of the AND should be 1), then neither cell 4-$i$, 4-$j$ will output a '0' to bitline BLn, and so the signal on bitline BLn will stay at 1. If either or both of cells 4-$i$, 4-$j$ is in the '0' bitstate (i.e. the result of the AND should be 0), then inverter 6-0 will output a '0' to bitline BLn, and so the sense amplifier BLn will drop to 0. Therefore, the signal level of the BLn bitline represents the result of the AND operation applied to each of the cells coupled to that bitline.

While FIG. 1 shows an example of performing an AND operation on bit values stored in two cells within the same column, it is also possible to apply the operation to three or more cells, by driving word lines for three or more rows simultaneously. Again, the bitline BLn of the selected column will stay high if all the selected cells are in the '1' bit state, indicating that the AND result is 1.

Also, while FIG. 1 shows an example for an AND operation, a NAND operation can be performed in the same way, except that the result of the NAND operation is the opposite to the result of the AND operation. Hence, for a NAND, if BLn stays high then the NAND result is 0, and if BLn drops low then the NAND result is 1. The NAND result can be obtained by inverting the signal sensed from the BLn bitline of the selected column.

NOR or OR operations can be performed in a similar way, except that this time the BLBn wordline for the selected column is sensed by the sense amplifier 14. Again, the bitlines for a selected column are precharged high, and wordlines for two or more cells within that column are asserted to couple these cells 4 to the bitlines BLn, BLBn. If all of the selected cells are in the '0' bit state (i.e. a NOR operation applied to all the selected cells will give a result of 1), then all of the selected cells will present a '1' value to the BLBn bitline and a '0' to the BLn bitline, and so the BLBn bitline will remain high. On the other hand, if any of the selected cells are in the '1' bit state (i.e. the NOR result should be 0), then the BLBn bitline will drop to 0 since at least one of the selected cells will present a '0' to bitline BLBn. Therefore, the value on bitline BLBn indicates the result of the NOR operation. Conversely the result of an OR operation can be indicated simply by inverting the value on bitline BLBn—if BLBn stays high then the OR result is 0, and if BLBn drops low then the OR result is 1. transistor 8-0. Again, the NOR or OR operation can be applied to two, three, or more cells within the same column.

Figure 2:
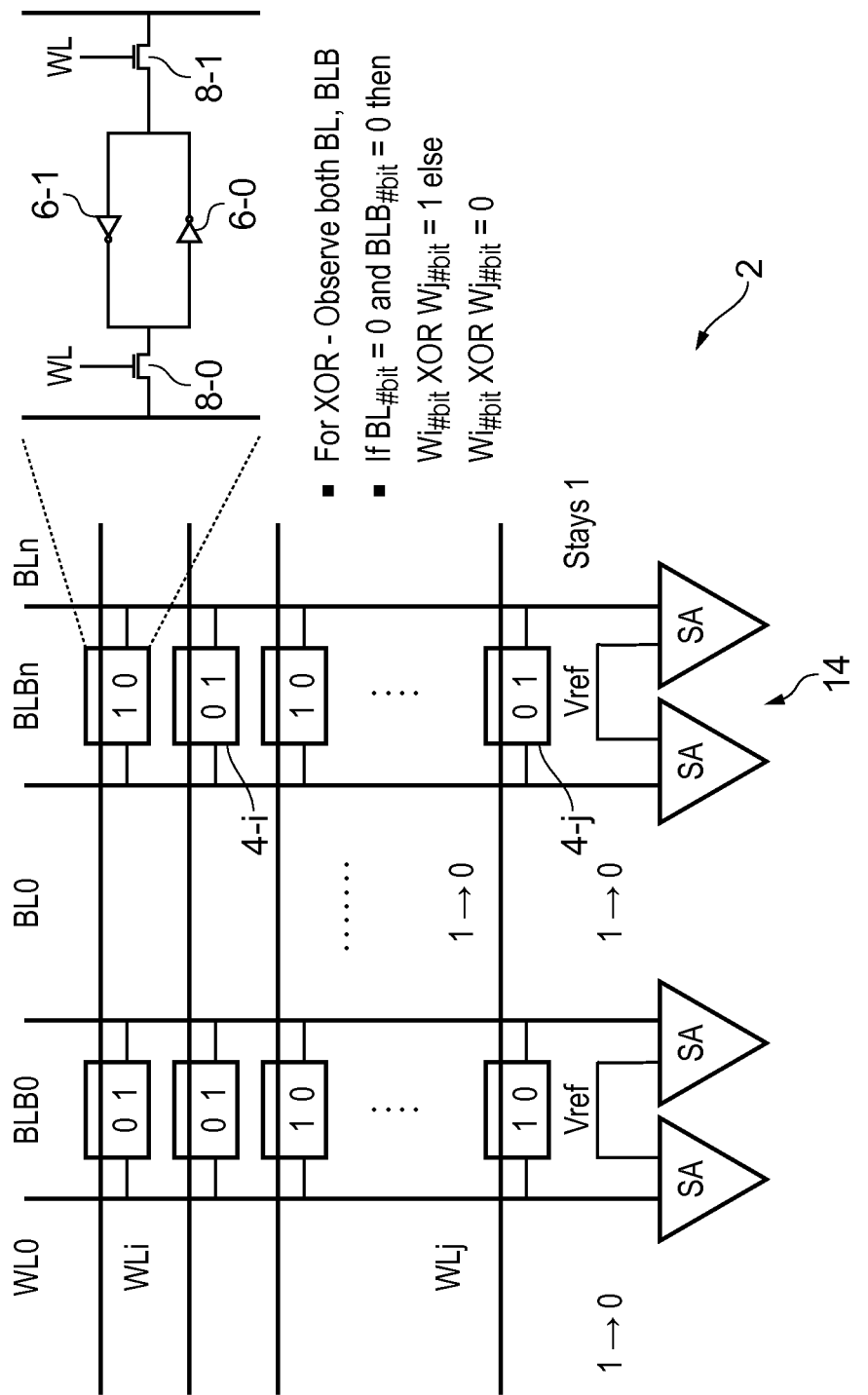
FIG. 2 shows an example of determining a result of an XOR operation within a storage device.

FIG. 2 shows another example of a logical operation performed within the storage device 2. In FIG. 2, the logical operation is an exclusive OR (XOR) operation. The wordline driver and address decoder 10, 12 are not shown for conciseness in FIG. 2. For the XOR operation, the bitlines BLn, BLBn for a selected column are again precharged and the wordlines for two rows WLi, WLj are asserted. For the XOR operation, the sense amplifier 14 for the selected column senses the signal levels on both bitlines BLn, BLBn. If the signals on bitlines BLn, BLBn both drop to 0 (e.g. see the example in column 0 of FIG. 2), then this means that one of the selected cells represents a '1' and the other represents a '0', and so the XOR result should be 1. On the other hand, if either bitline BL, or bitline BLB stays high then this means that all the cells are in the same state, and so the result of the XOR operation should be 0. For example, for XOR the values from bitlines BLn, BLBn may be passed to a NOR gate, and the output of the NOR gate may indicate the XOR. In a similar way, an exclusive NOR (XNOR) operation can also be supported simply by inverting the result of the XOR operation, or by passing the values sensed from BLn, BLBn to an OR gate with the output of the OR gate representing the XNOR result.

While FIGS. 1 and 2 show examples of performing a logical operation on two or more bits within the same column, if each row of cells 4 is considered to represent a data word then a bitwise logical operation can be applied to two or more data words by performing the operations described above in parallel for multiple columns, and then determining the overall result of the bitwise logical operation based on the outcome in each column.

Hence, these examples show that the results of logical operations such as AND, NAND, OR, NOR, XOR and XNOR can be generated within the storage device 2, and so there is no need to send the data value stored in the storage device 2 to a processor or some other kind of processing circuit downstream from the sense amplifier in order to determine the result of the logical operation. This saves processing at the processing circuit, freeing time or resource for performing other operations. Also, this helps to reduce the number of memory accesses, since a single access to memory can yield the result of the logical operation, rather than requiring separate read accesses to read out each individual value to be combined in the logical operation. Hence, this approach can provide a performance improvement within a data processing apparatus comprising the storage device 2.

Since multiple cells within the same column are activated and coupled to the bitline simultaneously, in some memory instances there could sometimes be a risk that the state stored in one of the activated memory cells could change based on the state of one of the other cells coupled to the same set of bitlines. To avoid such read disturbance in cells of simultaneously accessed rows, the wordline voltage can be lowered or the supply voltage to the cell raised, so that the access transistors 8 for these cells turn on less strongly. Hence, the wordline voltage may be lower than a supply voltage provided to the inverters 6-0, 6-1 within the memory cell. This means that even if the signals on the bitlines BL, BLB swing completely to the opposite state to the state stored in the bitcell 4, read disturbance can be avoided. Any known read assist or read disturbance avoidance technique can be used to reduce the wordline voltage.

Figure 3:
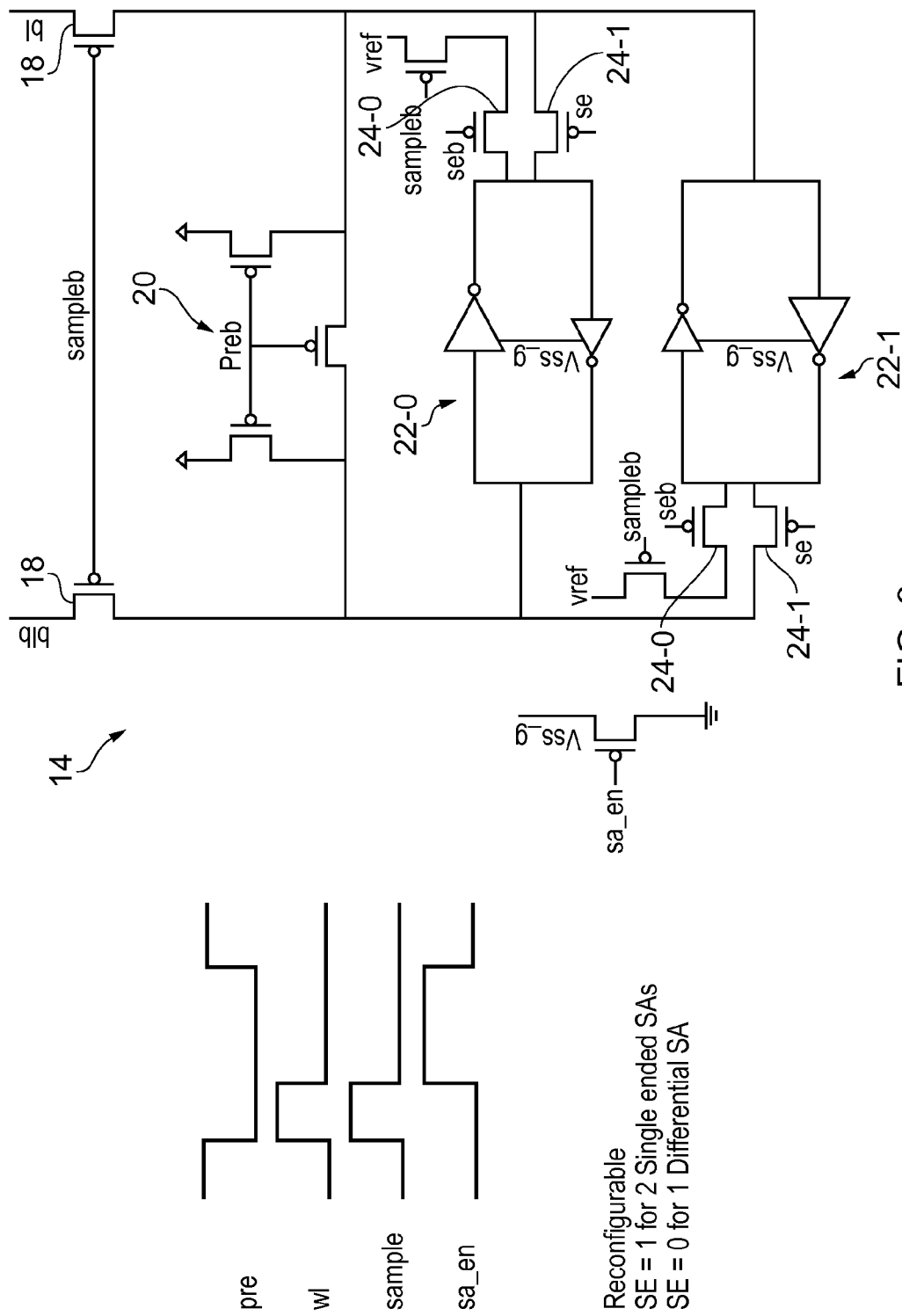
FIG. 3 shows an example of a sense amplifier having a differential sensing mode and a single-ended sensing mode.

FIG. 3 shows an example of a sense amplifier 14 which may be used in the storage device shown in FIGS. 1 and 2. The sense amplifier 14 has a single-ended sensing mode in which the signal level on each bitline BL, BLB is independently compared against a reference voltage, and the signal on one bitline does not influence the signal on the other bitline. This is useful for supporting the logical operations discussed above. It would be possible to operate the sense amplifier 14 in the single-ended sensing mode for read operations as well, but faster read operations can be performed using a differential sensing mode in which the sense amplifier senses the difference between a pair of bitlines BL, BLB, because in the differential sensing mode the sense amplifier 14 can amplify any differences between the bitline to pull the bitlines towards opposite states more quickly.

Therefore, FIG. 3 shows a reconfigurable sense amplifier design which supports both differential and single-ended sensing modes. The sense amplifier 14 includes sampling transistors 18 for selectively coupling the sense amplifier 14 to the bitlines BL, BLB. Precharge circuitry 20 is provided for coupling the bitlines to a precharge voltage so as to bring the bitlines high at the start of a read or compute operation. The sense amplifier 40 includes two pairs 22-0, 22-1 of cross coupled inverters and control gates 24-0, 24-1 for selecting whether the sense amplifier 14 is in the single ended or differential sensing mode. In the differential sensing mode used for a read operation, a control signal se is 0 and so control gates 24-0 are off and control gates 24-1 are on, so that each pair of cross coupled inverters is connected to both bitlines BL, BLB. Depending on the state of the storage cell being read, one of the bitlines drops low, causing the pairs of cross-coupled inverters to pull that bitline further down to 0. This provides a quick sensing operation which allows read operations to be performed more quickly. On the other hand, for the single ended sensing mode the control signal se is brought high to turn on gates 24-0 and turn off gates 24-1. Now each pair of cross coupled inverters is coupled between one of the bitlines and a reference voltage vref. The first cross-coupled pair 22-0 is coupled to bitline BLB and if bitline BLB drops below the reference voltage then this is sensed and the bitline is pulled down further by the cross couple 22-0. The second cross-coupled pair 22-1 does the same for bitline BL. In this way, the level on each bitline can be independently compared against the reference voltage. The states of each pair of cross coupled inverters can then be read out to determine the result of the compute (logical) operation in the way discussed above. it will be appreciated that many other sense amplifiers designs may also be used.

FIG. 3 shows an example where, within each cross-coupled pair 22-0, 22-1, one of the inverters has a greater drive strength than the other. In both pairs, the inverter whose input receives the reference voltage vref has a weaker drive strength than the other inverter. However, this is not essential, and in other examples it is possible to provide pairs of inverters having equal drive strength. Skewing the inverter sizes is not necessary if a reference voltage vref is provided for comparing against the signal level on the bitline bl or blb. On the other hand, if vref=vdd, then skewing the inverter sizes in each pair as shown can be useful for generating reference internally.

Figure 4:
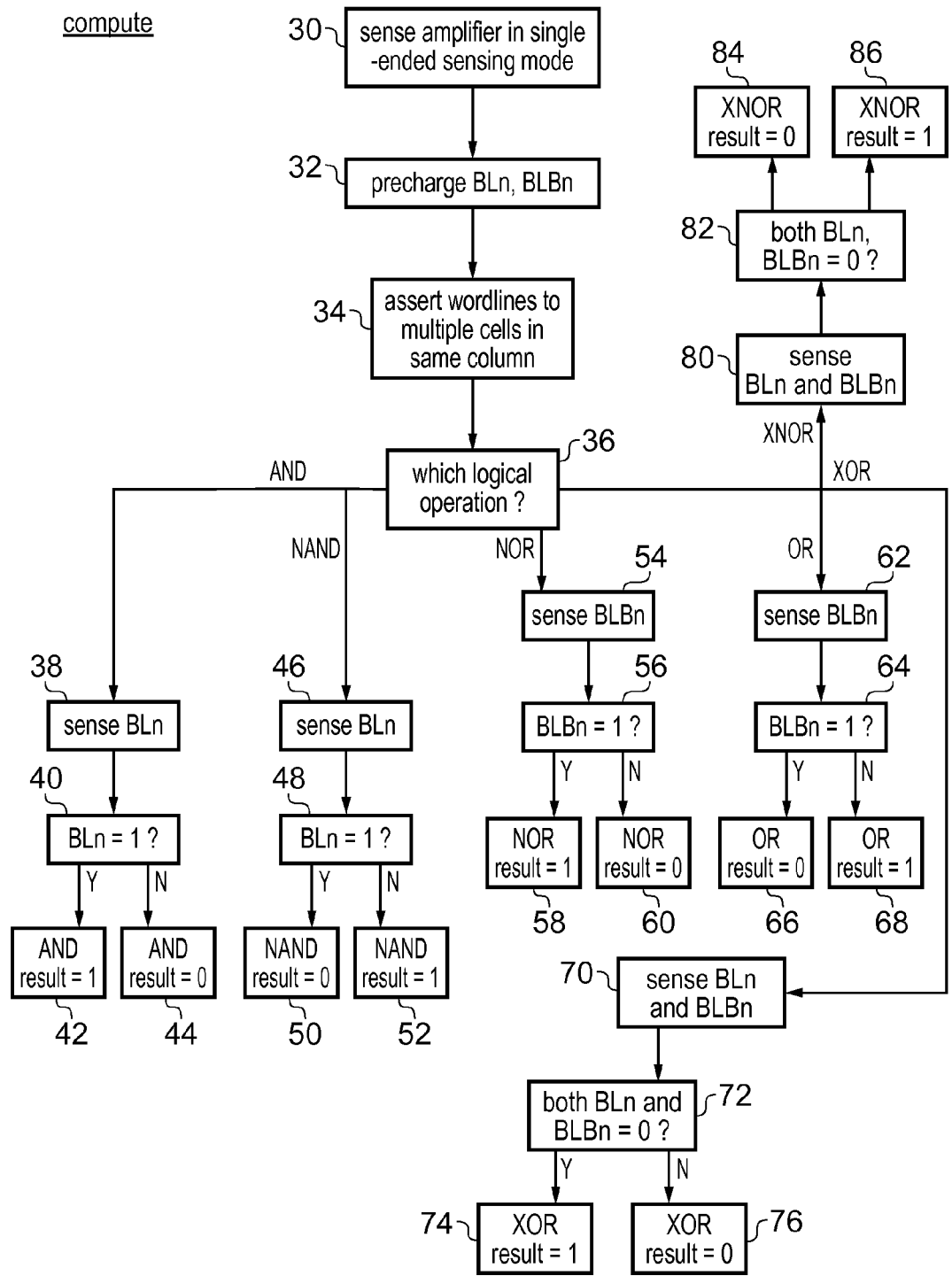
FIG. 4 shows a method of determining a result of a logical operation within a storage device.

FIG. 4 shows a method of performing a compute operation to generate the result of a logical operation applied to data values in two or more cells of the storage device. At step 30 the sense amplifier is placed in the single-ended sensing mode. At step 32 the bitlines BL, BLB for at least one selected column are precharged to 1. At step 34 the wordlines for two or more rows are asserted by the wordline driver 10, to select multiple cells per column. The wordline driver selects which wordlines to assert based on addresses provided. At step 36 it is determined which logical operation is being performed. For an AND operation, at step 38 the sense amplifier 14 senses bitline BLn, checks whether BLn is 1 at step 40, and if so then the AND result is determined to be 1 at step 42. If the bitline BLn is 0 then at step 44 it is determined that the AND result is 0. For a NAND operation, the bitline BLn is sensed at step 46 and it is determined whether the signal on BLn is 1 at step 48. If so, then the NAND result is 0 (step 50), while if BLn is 0 then the NAND result is 1 (step 52). For a NOR operation the sense amplifier 14 senses the signal level on bitline BLBn at step 54. It is determined at step 56 whether the signal on BLBn is 1. If so, then the NOR result is equal to 1 (step 58), while if BLBn is 0 then the NOR result is 0 at step 60. Similarly for an OR operation the bitline BLBn is sensed at step 62 and it is determined at step 64 whether the signal on BLBn is 1. If so, then the OR result is 0 at step 66 while if BLBn is 0 then the OR result is 1 at step 68. For an XOR operation, at step 70 the signal levels on both bitlines BLn and BLBn are sensed and it is determined whether both have dropped to 0 at step 72. If so, then the result of the XOR operation is 1 at step 74. If either of the bitlines BLn, BLBn is still 1 then at step 76 it is determined that the XOR result is 0.

If the logical operation is XNOR, then steps 80, 82 are the same as steps 70, 72 for XOR, but this time if both BLn and BLBn are 0 then the XNOR result is 0 (step 84), and if either BLn or BLBn is 1, then the XNOR result is 1 (step 86). Steps 36 to 86 can be performed for multiple columns in parallel. Also, the results of two or more of the different kinds of logical operation applied to the same set of cells could be determined simultaneously by sensing BLn, BLBn and interpreting the values read from BLn, BLBn in the different ways shown in FIG. 4.

Figure 5:
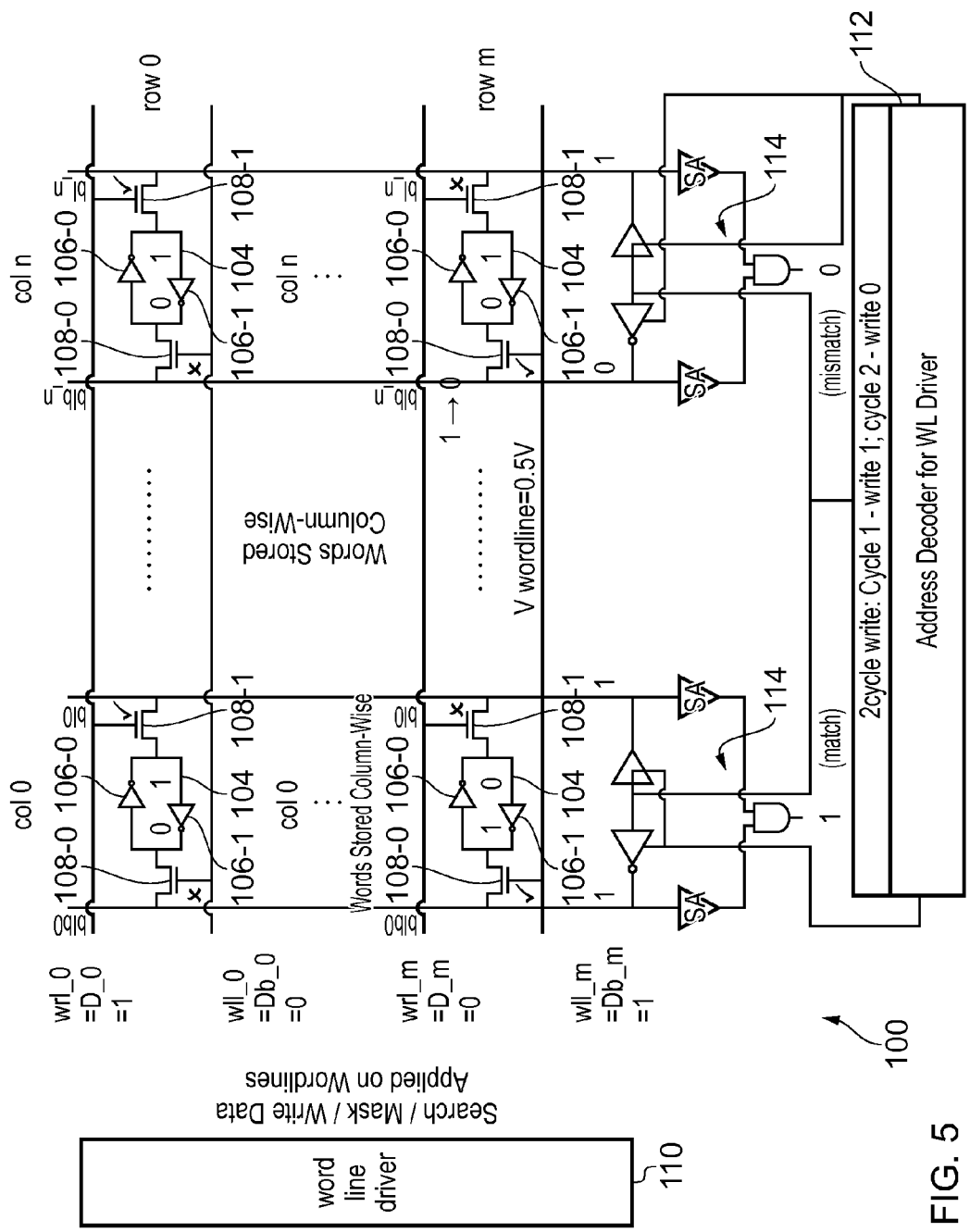
FIG. 5 shows an example of a storage device having a non-content-addressable mode and a content-addressable mode, and shows an example of performing a read operation using the storage device in a binary content-addressable mode.

FIG. 5 shows an example of a storage device 100 comprising an array of storage cells 104 arranged in rows and columns. The storage device has a non-content-addressable (or SRAM) mode supporting read or write operations, and a content-addressable mode (binary or ternary content addressable mode) supporting at least a search operation and a write operation. In the non-content-addressable mode, the storage device 100 functions as an SRAM, while in the content-addressable mode, the storage device 100 functions as a binary content addressable memory (BCAM) or ternary content addressable memory (TCAM) in which the memory can be searched for data words which match a "search key" supplied as an input. Some embodiments may only support one or other of the BCAM and TCAM modes, while other examples may support both BCAM and TCAM modes. The current mode may be selected based on a control input which configures control circuitry for the storage device (e.g. an address decoder, word line driver and sense amplifier) to generate appropriate control signals and sense results for these modes as discussed below. The current mode may be selected dynamically (so that the same storage device sometimes operates in one mode and sometimes in another) or relatively statically (so that the same storage device design can be provided in multiple devices, but some of these devices use the storage device in the SRAM mode and other devices use the storage device in the BCAM or TCAM modes).

The storage device 100 comprises an array of 6T (6 transistor) SRAM bitcells 104 each comprising a pair of cross-coupled inverters 106 and access transistors 108. 6T cells are generally more area efficient than 9T/10T/16T bitcells used in typical BCAM or TCAM designs. By using 6T cells the circuit area can be greatly reduced, not only because there are fewer transistors but also because the layout of 6T SRAM cells can be made more compact using pushed rule design techniques known in the art. Therefore there can be a significant area advantage from using 6T SRAM cells. Also, the example shown in FIG. 5 provides the content addressable search operation and write operations in the BCAM/TCAM modes using the same wordlines and bitlines that are used for a read or write in the SRAM mode (with the wordlines being split so that there are two wordlines per row), which is not possible with typical BCAM/TCAM designs which provide search and match lines for the search operation which are distinct from the wordlines and bitlines.

As shown in FIG. 5 the storage device 100 has two wordlines per row of cells 104. The two wordlines for the same row are referred to below as left and right wordlines (wll, wlr), but the terms "left" and "right" are labels used for ease of reference, and do not necessarily imply any particular positioning of the wordlines in an integrated circuit. Each cell has access transistors 108-0, 108-1 for coupling that cell's cross-coupled inverters 106-0, 106-1 to the bitlines bl, blb for that column. The access transistor 108-0 has its gate coupled to the left wordline wll for the corresponding row, and in response to assertion of the left wordline couples the cross-coupled inverters to the blb bitline for the corresponding column. Similarly, the access transistor 108-1 has its gate coupled to the right wordline wlr for the corresponding row, and in response to assertion of the right wordline couples the cross-coupled inverters to the bl bitline for the corresponding column. Hence, the provision of two wordlines allows each cell to be independently coupled to each bitline, so that it can be coupled to one bitline but not the other. This is useful for implementing the content-addressable mode.

Each column of cells has a corresponding sense amplifier 114 which has a single-ended sensing mode and differential sensing mode. For example the sense amplifier 114 may be implemented using the circuit shown in FIG. 3. The single-ended sensing mode is used in the content-addressable mode (BCAM or TCAM) and the differential sensing mode is used in the non-content-addressable (SRAM) mode. The storage device 100 also has a word line driver 110 for generating control signals for the wordlines wll, wlr, and an address decoder 112 for decoding addresses supplied to the memory to generate control signals for selecting cells (columns) corresponding to the selected addresses.

Figure 6:
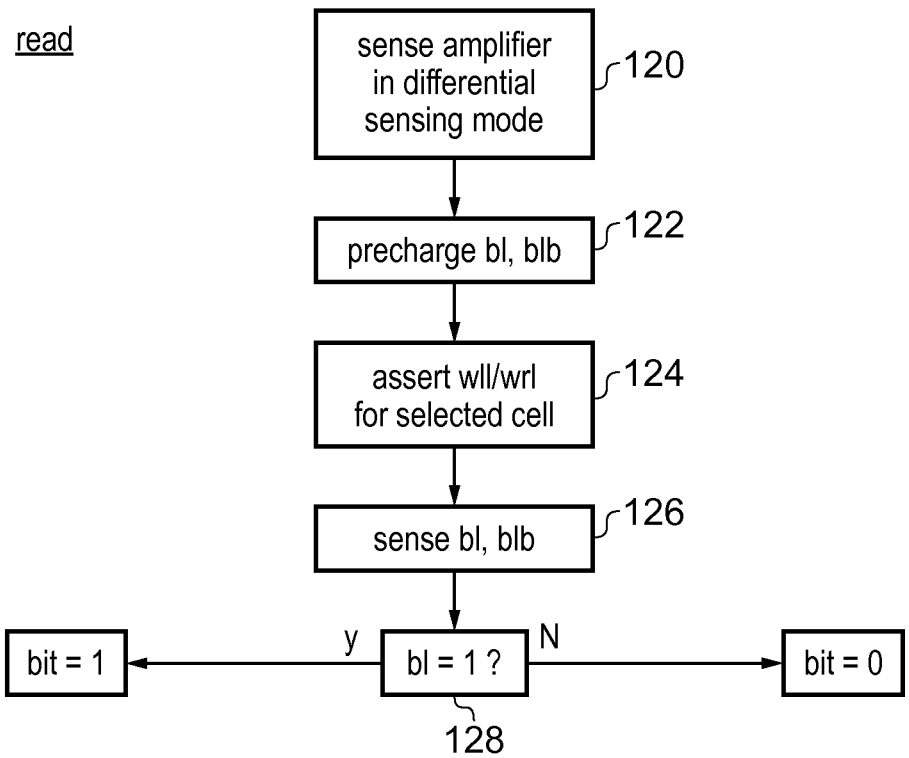
FIG. 6 shows a method of performing a read operation in the non-content-addressable mode.

FIG. 6 shows a method of performing a read operation during the non-content-addressable (SRAM) mode. At step 120, the sense amplifier 114 for a selected column is operated in the differential sensing mode. At step 122, the bitlines bl, blb for the selected column are precharged to 1. At step 124, the wordline driver 110 asserts both the left and right wordlines wll, wlr for a row of cells containing the selected cell, depending on the read address supplied to the decoder 112. At step 126, the sense amplifier for the selected column senses the bitlines bl, blb for that column, and at step 128 it is determined whether the signal on bitline bl is 1. If so, then the bit state for the selected cell is 1, and if bl is 0 then the bit state of the selected cell is 0. It will be appreciated that bits stored in cells of the same row in multiple columns could be read simultaneously using the sense amplifiers of each column.

Figure 7:
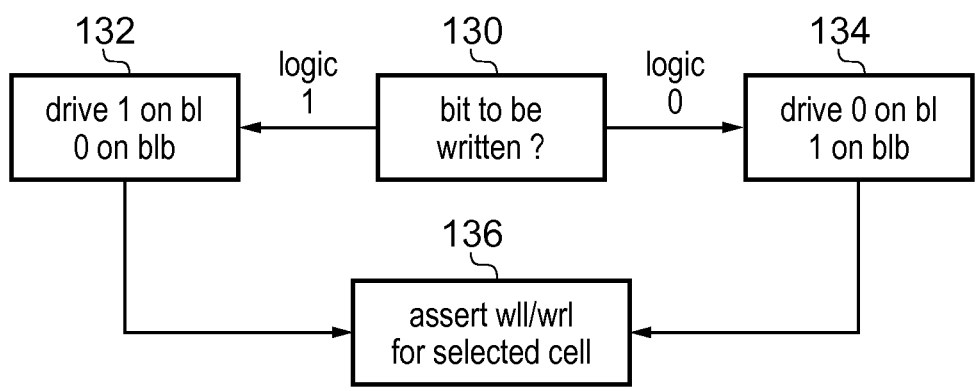
FIG. 7 shows a method of performing a write operation in the non-content-addressable mode.

FIG. 7 shows a method of performing an SRAM write during the non-content-addressable mode. The address decoder receives an address for a selected cell and write data specifying a bit to be written to the cell. It is determined whether the write data is 1 or 0 (step 130). If the write data is 1 then the bitline bl for the column containing the selected cell is driven to 1 and the opposite bitline blb is driven to 0 (step 132). On the other hand, if a 0 is to be written to the cell, then bitline bl is driven to 0 and bitline blb driven to 1. At step 136, the wordline driver 110 asserts both of the left and right wordlines wll, wlr for the row containing the selected cell, and this causes the access transistors 108 for that cell to couple the cell to both bitlines bl, blb for the corresponding column so that the cross-coupled inverters are placed in a bitstate corresponding to the signals driven on the bitlines bl, blb. Again, multiple cells of the same row can be written to simultaneously by driving bitlines of multiple columns with respective patterns of 0-1 and 1-0 depending on whether each bit is to represent a binary value of 0 or 1.

In the non-content-addressable mode, the bits stored in cells of the same row may be considered to represent a data word comprising multiple bits, which can be read or written in a single cycle by asserting the wordlines to that row and sensing or driving signals on the bitlines for each column. Hence, in the non-content-addressable mode, data words may be stored row-wise.

In contrast, in the content-addressable mode, data words are stored column-wise within the storage device 100. Hence, each column may represent a data word with each cell within that column representing one data state of the data word. In the binary content-addressable (BCAM) mode, each data state represents either 1 or 0. In this example, a cell is considered to represent binary 1 if the output of inverter 106-0 is 1 and the output of inverter 106-1 is 0 (i.e. when coupled to the bitlines bitline bl would be 1 and bitline blb would be 0). Binary 0 is represented by the opposite state of the inverters. However, it will be appreciated that other implementations may choose the opposite mapping, in which case the control signals described below for applying search states of 0 and 1 would be reversed.

Figure 8:
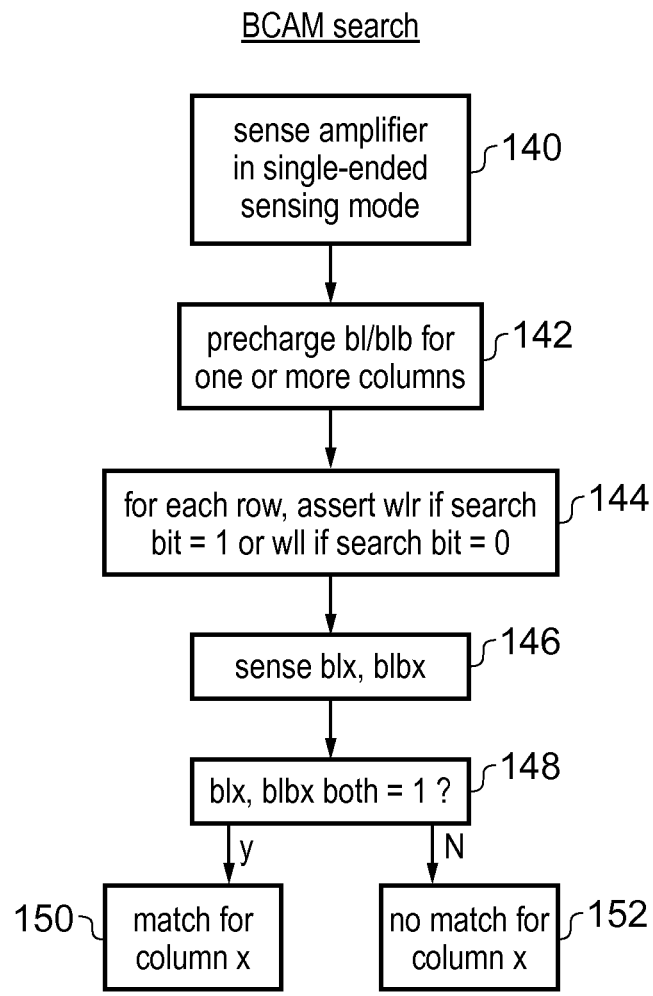
FIG. 8 shows a method of performing a search operation in a binary content-addressable mode.

FIG. 8 shows a method of performing a search operation in the BCAM mode. At step 140 the sense amplifier is operated in the single-ended sensing mode. At step 142, the bitlines bl, blb are precharged high for one or more columns for which the corresponding data words are to be compared against the search key (it is possible to only compare the search key against a subset of the stored data words, but for ease of explanation below we shall assume that the search key is compared against the data words in each column).

The word line driver 110 is supplied with a search key representing a string of search states which is to be compared against the corresponding data states of each data word stored in the storage device 100. In the BCAM mode, each search state represents either 1 or 0, and a search state is considered to match a corresponding data state if they are both in the same state. Each row corresponds to a respective search state of the search key. At step 144, the wordline driver 110 asserts signals on the left and right wordlines wll, wlr for each row of cells. The signals provided to the left and right wordlines wll, wlr depend on the corresponding search date within the search key. For each row, "Search_data" is applied to the right wordline wlr and "search_data_bar" (the search data inverted) is applied to the left wordline wll. Hence, for rows for which the corresponding search state is 0, the left wordline wll is asserted (=1) and the right wordline wlr is deasserted (=0), to turn on access transistor 108-0 and turn off access transistor 108-1 so that the cross-coupled inverters of cells 104 in that row are coupled to bitline blb but not bitline bl for the corresponding column. For rows for which the corresponding search state is 1, the right wordline wlr is asserted (=1) and the left wordline wll is deasserted (=0), so that access transistor 108-1 is turned on and access transistor 108-0 is turned off, so that the cross-coupled inverters of cells in that row are coupled to bitline bl but not bitline blb for the corresponding column.

Hence, following step 144, for each data word, bitline blb will be coupled to all cells for which the corresponding search state is 0. If all of these cells are in fact in the 0 data state, then they will output a 1 onto the blb bitline, and so the blb bitline will remain at its precharged state of 1. If any of these cells are 1, they will output a 0 onto the blb bitline and the blb bitline will be discharged.

Similarly, following step 144, for each data word, bitline bl will be coupled to all cells for which the corresponding search state is 1. If all of these cells are actually in the 1 data state, they will output a 1 onto the bl bitline, and so the bl bitline will remain high lf any of these cells are in the 0 data state, they will output a 0 onto the bl bitline, causing the bl bitline to discharge.

Therefore, in the BCAM mode, if neither of bitlines bl, blb for a column are discharged, this indicates that all the cells in rows corresponding to a '0' search state match the search state, and that all the cells in rows corresponding to a '1' search state match the search state, i.e. the entire data word matches the search key. If one or both bitlines bl, blb are discharged, there is no match as at least one cell has a different data state to the corresponding search state. Hence, at step 148, the sense amplifier detects whether the bl, blb bitlines for the selected column are both 1. If so, then at step 150 it is determined that there is a match condition for that column, while if one or both bitlines bl, blb is 0, then there is no match condition.

For example, in FIG. 5 the search state for row 0 is '1' and the search state for row m is '0'. In column 0, the cells in both rows match the search state for that row, so the bitlines bl0, blb0 both stay high and a match indication is output. In contrast, for column n, the cell in row m is in the '1' data state, which does not match the '0' search state applied to this row, causing the blb_n bitline for column n to drop to 0, so a mismatch is output.

In this way, an array of 6T SRAM cells can be operated as a BCAM by applying control signals based on search states to pairs of wordlines corresponding to each row, and single-endedly sensing the levels on the bitlines bl, blb for each column.

To protect against read disturbance during the BCAM search operation, the wordline voltage may be reduced or the supply voltage to the cells increased so that the wordline voltage is lower than the supply voltage for the bitcells being searched. For example the wordline voltage may be 0.5 volts while the supply voltage for the cells may be 0.9V. More generally, if the supply voltage is approximately Vdd, then the wordline voltage may be approximately Vdd/2 (it does not need to be exactly half the supply voltage). This avoids one cell in a column causing a flip of the bit state of another cell in the same column when they are connected to the same bitline.

Figure 9:
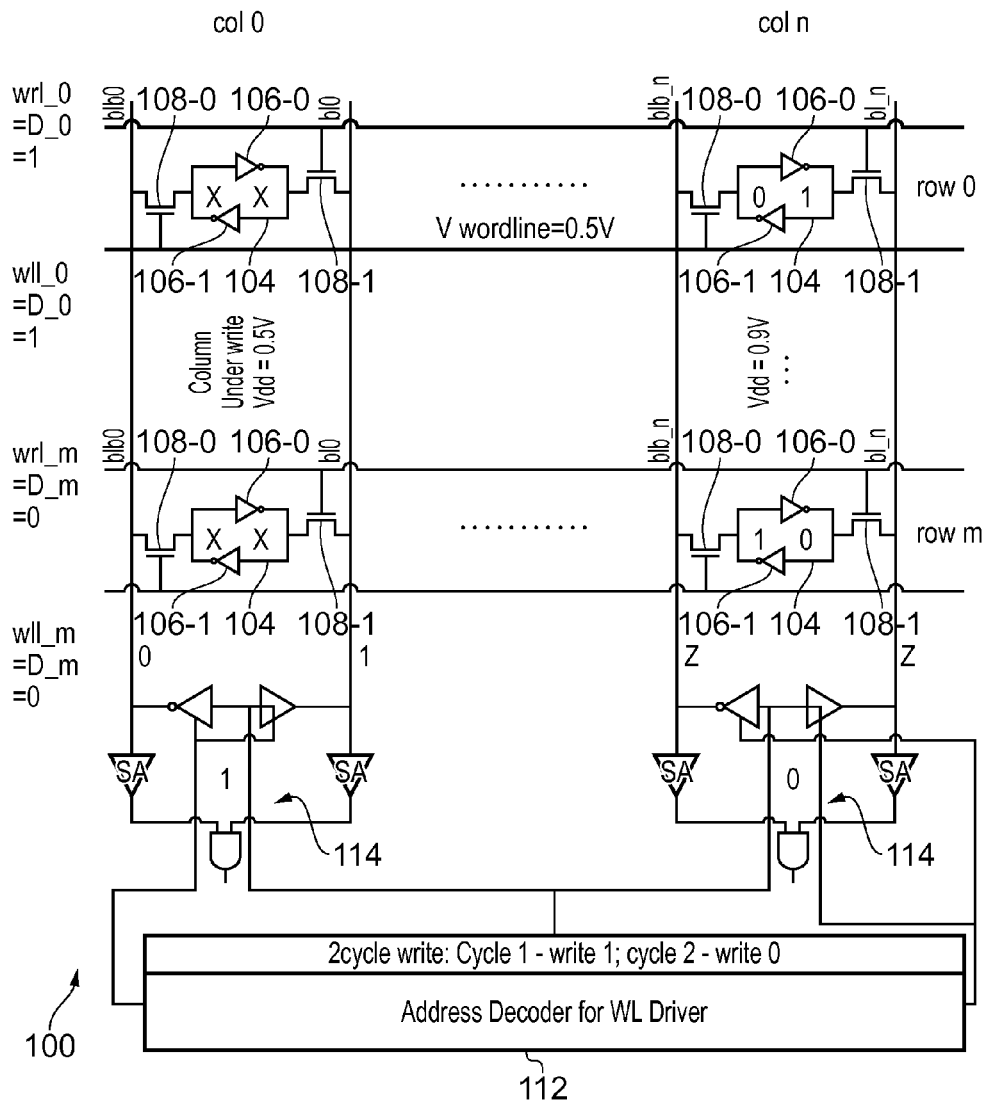
FIG. 9 shows an example of performing a write operation in the binary content-addressable mode.
Figure 10:
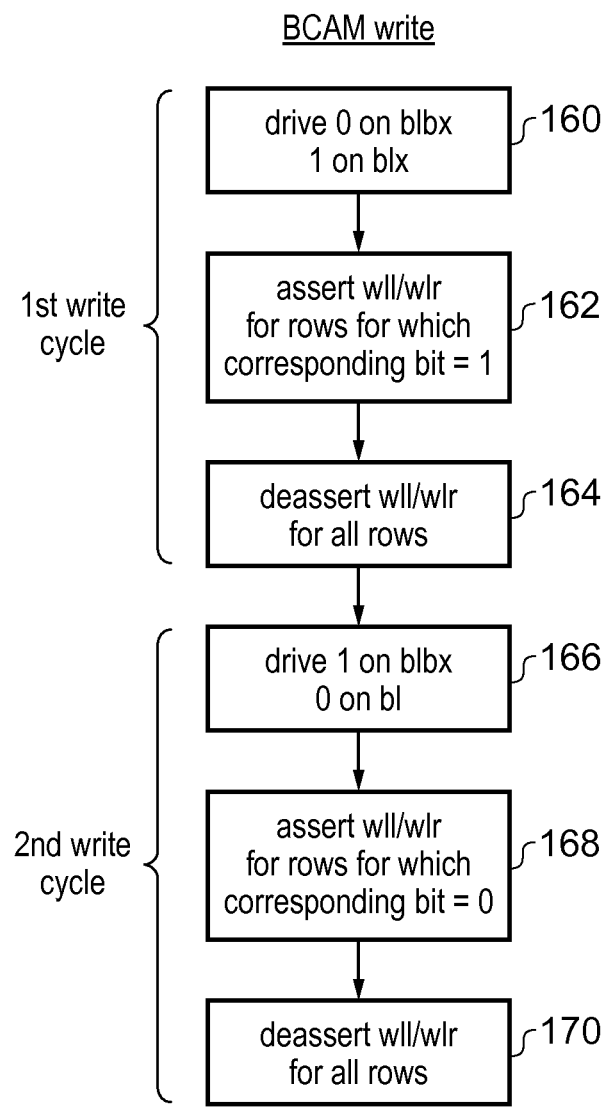
FIG. 10 shows a method of performing a write operation in the binary content-addressable mode.

FIG. 9 shows an example of writing a data word to the storage device 100 when in the binary content addressable mode. Data words are written column-wise to storage cells within the same column. The address decoder 112 selects one column to be written based on the write address. The write is performed in two cycles, one for writing the cells which are to store a bit state of 1 and the other for writing cells which are to store a bit state of 0. It does not matter which cycle is performed first. For example, FIG. 10 shows a method of performing the write operation in the BCAM mode in which the first write cycle writes '1' and the second write cycle writes '0', but this could be the other way round.

The first write cycle comprises steps 160, 162, 164. At step 160, the bitline blbx for a selected column x is driven to 0 and the other bitline blx is driven to 1. At step 162 both wordlines wll, wlr are asserted (=1) for the rows for which the corresponding data state is to be 1. This turns on access transistors 108-0, 108-1 for those rows so that the cells in these rows are placed in the '1' state in which inverter 106-0 outputs 1 and inverter 106-1 outputs 0. The wordlines wll, wlr for other rows remain at 0, so that cells in these rows are not written. At step 164 the wordlines are then deasserted. The second write cycle comprises steps 166, 168, 170 which are similar to steps 160, 162, 164 except that at step 166 bitline blbx is 1 and bitline blx is 0 (the opposite way round from step 160), and at step 168 both left and right wordlines wll, wlr are asserted for the rows for which the corresponding bit is 0, to write the 0 state into those rows, leaving the 1s in other rows intact.

To avoid disturbing the bit states in cells in other columns that are not being written, the wordline voltage and the supply voltage for the column being written is lower than the supply voltage for other columns. For example, in FIG. 9 the wordline voltage and supply voltage to column 0 (the column under write) are 0.5V while the supply voltage to column n is 0.9V.

Figure 11:
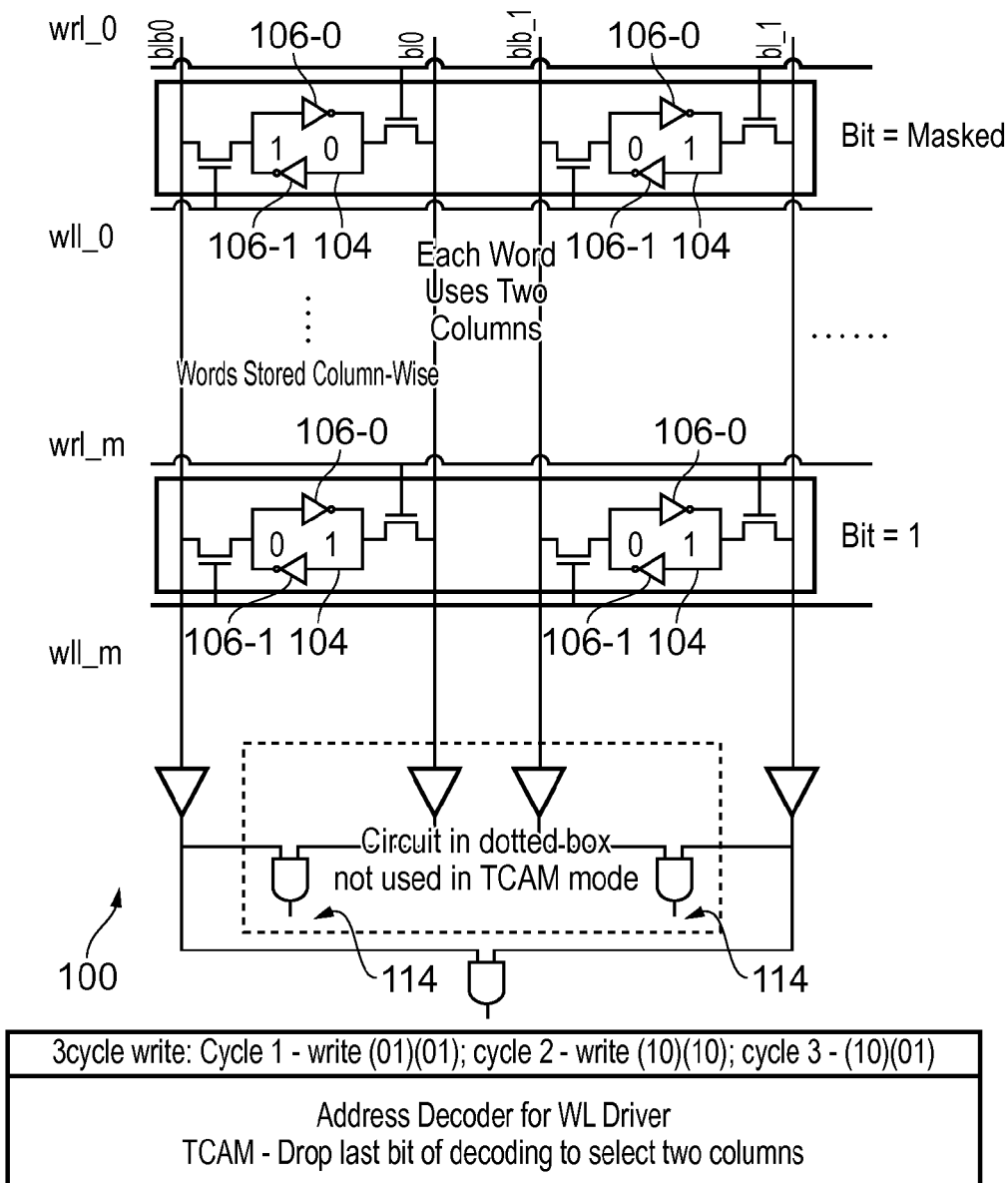
FIG. 11 shows an example of operating the storage device in a ternary content-addressable mode.

FIG. 11 shows an example of operating the storage device 100 in the ternary content-addressable (TCAM) mode. In the TCAM mode, each data word is stored column-wise across a pair of adjacent columns of the memory array and each data state within a data word is represented using the bit states stored in the two bit cells within the same row of the two adjacent columns. This allows each data state to represent one of three possible states as shown in Table 1:

TABLE 1

| Data state | Left cell state (column x) | Right cell state (column x + 1) |
| --- | --- | --- |
| 0 | 0 | 0 |
| 1 | 1 | 1 |
| X | 0 | 1 |
| Reserved | 1 | 0 |

(with a cell state of 0 represented by inverter 106-0 outputting 0 and inverter 106-1 outputting 1, and a cell state of 1 represented by inverter 106-0 outputting 1 and inverter 106-1 outputting 0).
Similarly, the search states of the search key can be in three different states as indicated by the left and right wordlines asserted for the corresponding row according to Table 2:

TABLE 2

| Search state | Left word line wll | Right word line wlr |
| --- | --- | --- |
| 0 | 1 | 0 |
| 1 | 0 | 1 |
| X | 0 | 0 |
| Reserved | 1 | 1 |

The X state shown in Tables 1 and 2 represents a mask state which is considered to match against any state. Hence, in the TCAM mode, whether a search state matches a data state is based on the rules shown in Table 3:

TABLE 3

| Search state | Data state | Match? |
| --- | --- | --- |
| 0 | 0 | 1 |
| 1 | 1 | 1 |
| 0 | 1 | 0 |
| 1 | 0 | 0 |
| X | Any state | 1 |
| Any state | X | 1 |

Hence, in the TCAM mode there is only a mismatch if one of the search/data states is 0 and the other is 1. All other combinations of search/data states are considered to match.

For a search operation in the TCAM mode, the sense amplifiers 114 of the pair of adjacent columns operate together with one sense amplifier 114 sensing the bl bitline of one column and the other sense amplifier 114 sensing the blb bitline of the other column. The other bitlines are not required for a search operation in the TCAM mode. In the example of FIG. 11, the outer bitlines of the pair of columns are used so that the sense amplifier for the left-hand column senses the blb0 bitline and the sense amplifier for the right-hand column senses the bl1 bitline. However, it will be appreciated that similar results could be achieved by sensing the bl0 and blb1 bitlines instead. The sense amplifiers operate in the single-ended mode during the TCAM mode.

The read protocol is similar to that used for the BCAM mode. The bitlines are precharged, and the left/right wordlines are asserted with signals depending on the search state according to Table 2 above. The signals on the bitlines blb0, bl1 for the pair of columns then indicate whether there is a match for that column.

Figure 12:
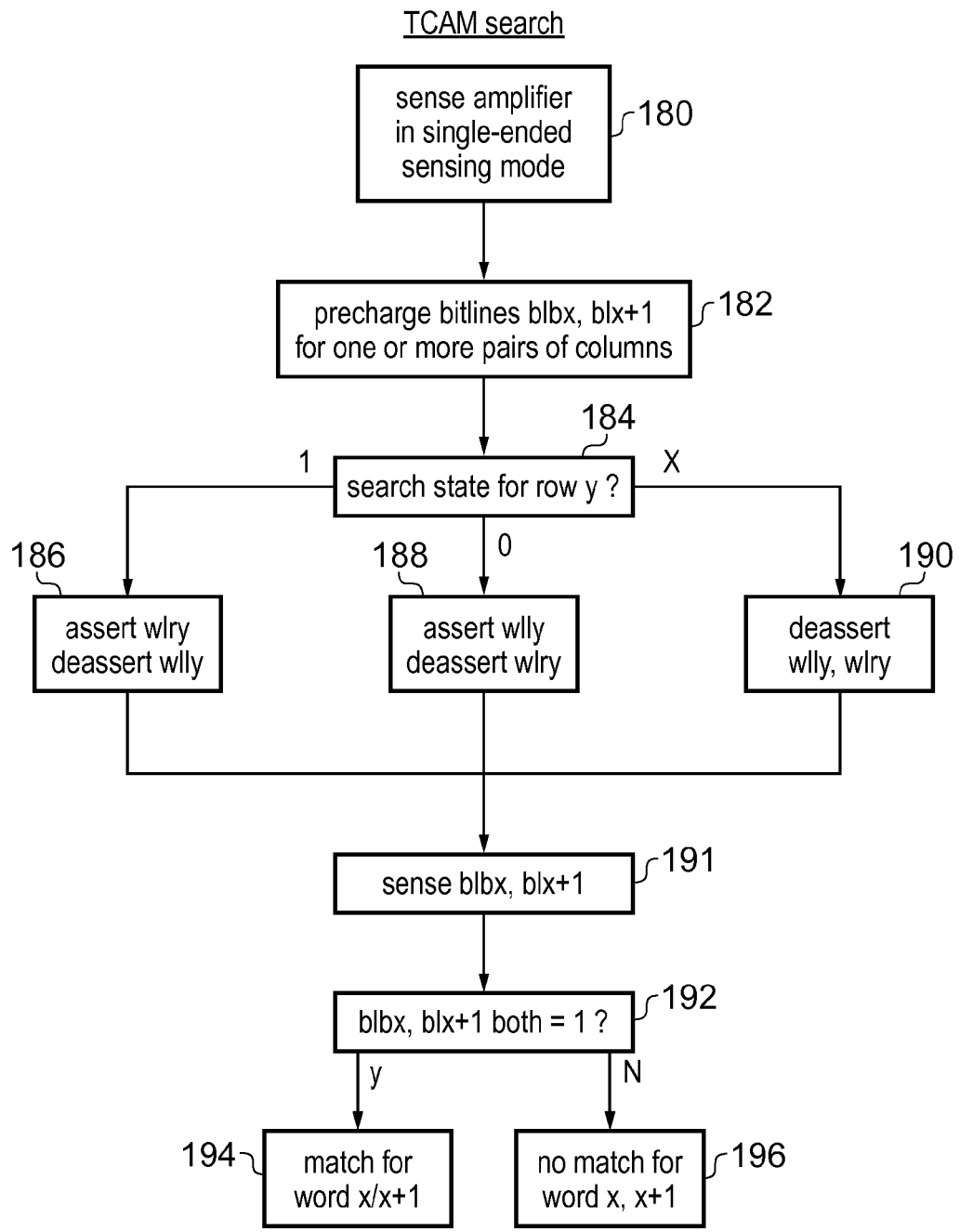
FIG. 12 shows a method for performing a search operation in the ternary content-addressable mode.

FIG. 12 shows a method of performing a search operation in the TCAM mode. At step 180 the sense amplifier is placed in the single ended sensing mode. At step 182, the bitlines blbx, blx+1 for a pair of adjacent columns are precharged for each data word to be searched (note that blx and blbx+1 need not be precharged). This can be done for multiple pairs of columns in order to search through several data words at once. At step 184 the search state for each row y is determined. For rows for which the search state is 1, at step 186 the right wordline wlry is asserted and the left wordline wlly is deasserted. For rows for which the search state is 0, at step 188 the left wordline wlly for the row is asserted and the right wordline wlry deasserted. For rows where the search state is the mask state X, at step 190 both wordlines wlly, wlry are deasserted. Steps 184-190 correspond to the search states shown in Table 2.

At this point, for each data word represented by a pair of columns, bitline blbx will be coupled to the left-hand cell of any rows for which the corresponding search state is 0. If all these rows represent either the 0 data state or the X data state, the left-hand cell will be in the 0 bit state (see Table 1), and will output 1 onto the blbx bitline, so blbx will remain at its precharged state of 1. If any row represents the 1 data state, the left-hand cell will represent a bit state of 1 and will output a 0 onto the blbx bitline so that blbx will be discharged.

Similarly, bitline blx+1 will be coupled to the right-hand cell of any rows for which the corresponding search state is 1. If all of these cells are actually in the 1 data state or the X data state, the right-hand cell will represent a bit state of 1 (see Table 1), and will output 1 onto the bl bitline, and so the bl bitline will remain high. If any of these cells are in the 0 data state, they will output a 0 onto the bl bitline, causing the bl bitline to discharge.

For any rows for which the search state is X, both wordlines are deasserted, so that the cells in these rows are not coupled to either of the bitlines blbx, blx+1. Therefore, cells for which the search state is X do not affect the signal on bitlines blbx, blx+1.

Hence, the signals on bitlines blbx, blx+1 will be discharged if there is a row for which the search state is 0 and the data state is 1, and blx+1 will be discharged if there is a row for which the search state is 1 and the data state is 0. In all other cases, the bitlines blbx, blx+1 will stay high. Hence, the comparison result according to Table 3 above can be determined from the signals on bitlines blbx, blbx+1. At step 191 the sense amplifiers 114 sense the signal levels on bitlines blbx, blx+1. At step 192 it is determined whether both signal levels are 1. If so, then at step 194 a match condition is determined for the data word represented by columns x, x+1, and if one of the signals is 0 then at step 196 a mismatch is detected.

Figure 13:
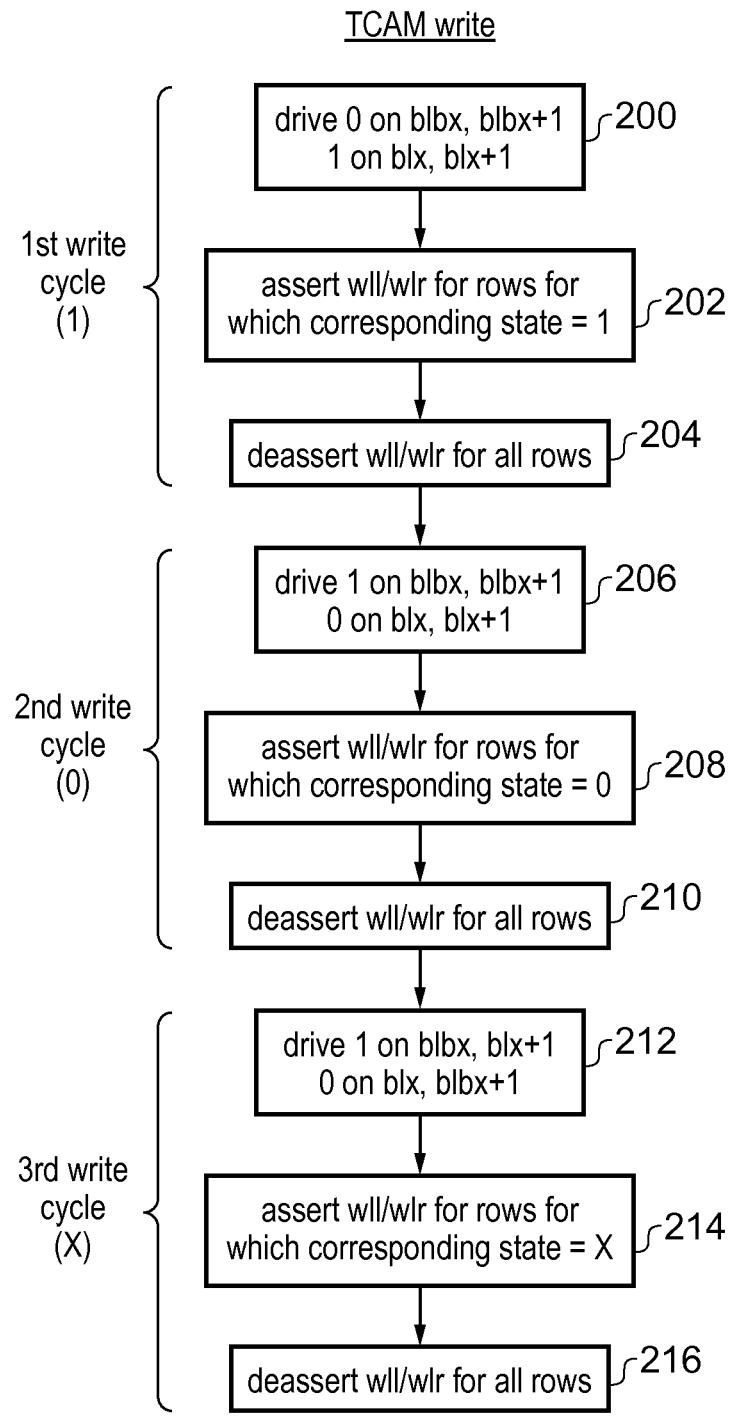
FIG. 13 shows a method of performing a write operation in the ternary content-addressable mode.

FIG. 13 shows a method performing a write in the TCAM mode. As in the BCAM mode, the write is performed in multiple cycles, but this time there are three cycles corresponding to the 0, 1 and X states respectively, which can be performed in any order. A data word is written to a pair of adjacent columns x, x+1. The first write cycle comprises steps 200, 202, 204. At step 200, the blb bitlines of each column are driven to 0 and the bl bitlines of each column are driven to 1. At step 202 the left and right wordlines wll, wlr are asserted for any rows to be written with a data state of 1. This turns on the access transistors 108-0, 108-1 for those rows to write the '1' data state into the pair of adjacent cells in that row (with both cells of the pair in the '1' bit state). At step 204 the wordlines for all rows are deasserted.

In the second write cycle for writing the 0 data state, steps 206, 208, 210 are the same as steps 200, 202, 204, except that at step 206 the blb bitlines for columns x, x+1 are 1 and the bl bitlines are 0, and at step 208 the wordlines are asserted for rows to be written with a 0 data state. In the third write cycle for writing the X data state, steps 212, 214, 216 are the same as for the first/second cycles, except that step 212 drives bitlines blbx, blx+1 to 1 and bitlines blx, blbx+1 to 0 (corresponding to the X state shown in Table 1), and step 214 asserts the left/right wordlines for rows to be written with the X state.

As in the BCAM mode, disturbance avoidance techniques can be used to prevent one bitcell causing the state of another bitcell to be changed during the search/write operations. Again, the wordline voltage may be lower than the supply voltage during the search operation, and the wordline voltage and supply voltage to a column being written may be lower than the supply voltage to a column not being written during the write operation.

Although the examples above represent each data word using cells within a single column for BCAM or a pair of columns for TCAM, if each data word requires a greater number of data states than can be accommodated in one column, then the data word could be split over several columns or pairs of columns in different banks. By providing the columns in different banks, this allows independent control over the wordlines for corresponding rows in different banks, so that each column within the same data word can be searched in parallel. For example, the sense amplifiers could sense a partial match result for a partial data word represented by each column or pair of columns, and then these partial match results can be combined to produce the match result for the overall data word.

Alternatively, the data word could be split over several columns or pairs of columns within the same bank, and in this case, the search operation may require multiple cycles, so that different search states can be applied sequentially on the wordlines for each partial data word of the overall data word, and the search results could be accumulated over several cycles.

Either way, splitting a data word over several columns may be useful because if the number of cells in one column becomes too large (e.g. greater than 128 bitcells), then leakage through each cell may cause the signal on a bitline to discharge even if all the cells in the column match the corresponding search state, which can affect reliability. This can be addressed by providing shorter columns and representing a larger data word across multiple columns or pairs of columns.

It will be appreciated that the particular bit states and control signals used to represent the data states and search states discussed above are just an example, and other implementations of the BCAM or TCAM modes may use other combinations of signals or bit states to represent the data/search states.

In summary, the technique shown above allows an array of 6T SRAM cells to be reconfigured to act as a BCAM or TCAM. While a second wordline is provided for each row of cells, this addition does not significantly change the integrated circuit layout of the memory device since the wordlines would typically be provided in an upper layer of an integrated circuit, and would not change lower layers of the integrated circuit providing the transistors of each memory cell. This means that conventional push-rule design techniques can still be used to provide an area-efficient bitcell layout.

It will be appreciated that some memory instances may use both the in-memory compute technique discussed with respect to FIGS. 1-4 and the reconfigurable SRAM/BCAM/TCAM technique discussed with respect to FIGS. 5-13.

Figure 14:
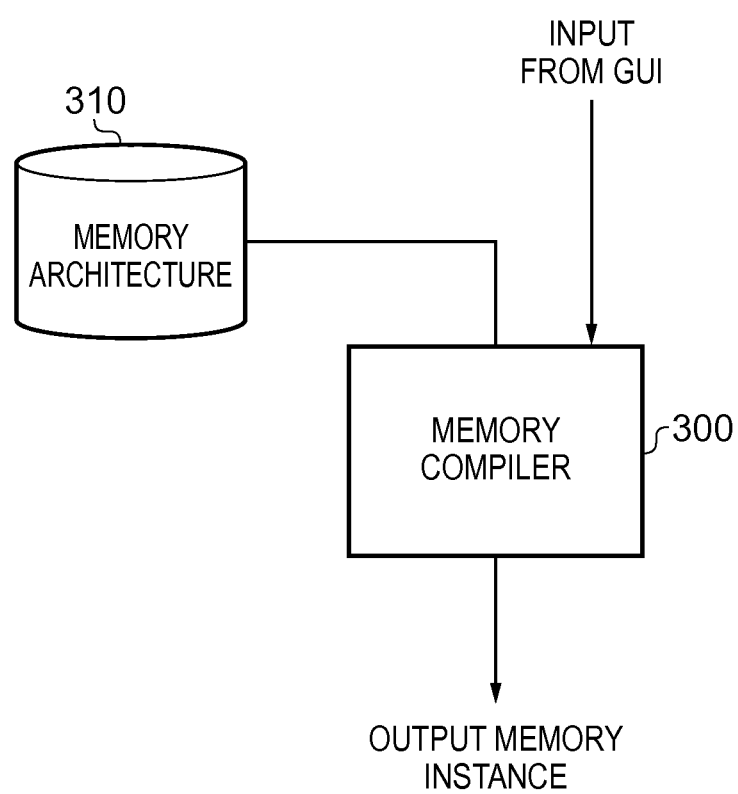
FIG. 14 shows an example of a memory compiler which can be used to generate an instance of a memory device.

FIG. 14 schematically illustrates how a memory instance supporting the techniques discussed above may be created from a memory compiler 300 with reference to a memory architecture 310. The memory architecture 310 specifies a definition of circuit elements and data defining rules for combining those circuit elements in order to create a memory instance. Particular requirements for the memory instance are entered into the memory compiler 300 as input parameters via a graphical user interface (GUI). As will be appreciated by those skilled in the art, such input parameters can specify various aspects of the desired memory instance, for example defining the size of the memory array, the multiplexing arrangements of the memory array, selection of various optional features such as power gating features, built-in-self-test (BIST) modes to be supported, etc. The memory compiler 300 then generates the required memory instance based on the input parameters and the memory architecture 310. In accordance with one embodiment, the memory compiler includes the components to implement the sense amplifiers, wordline driver and address decoder as discussed above, as well as providing two wordlines per row of cells in the example of FIGS. 5 to 13.

Figure 15:
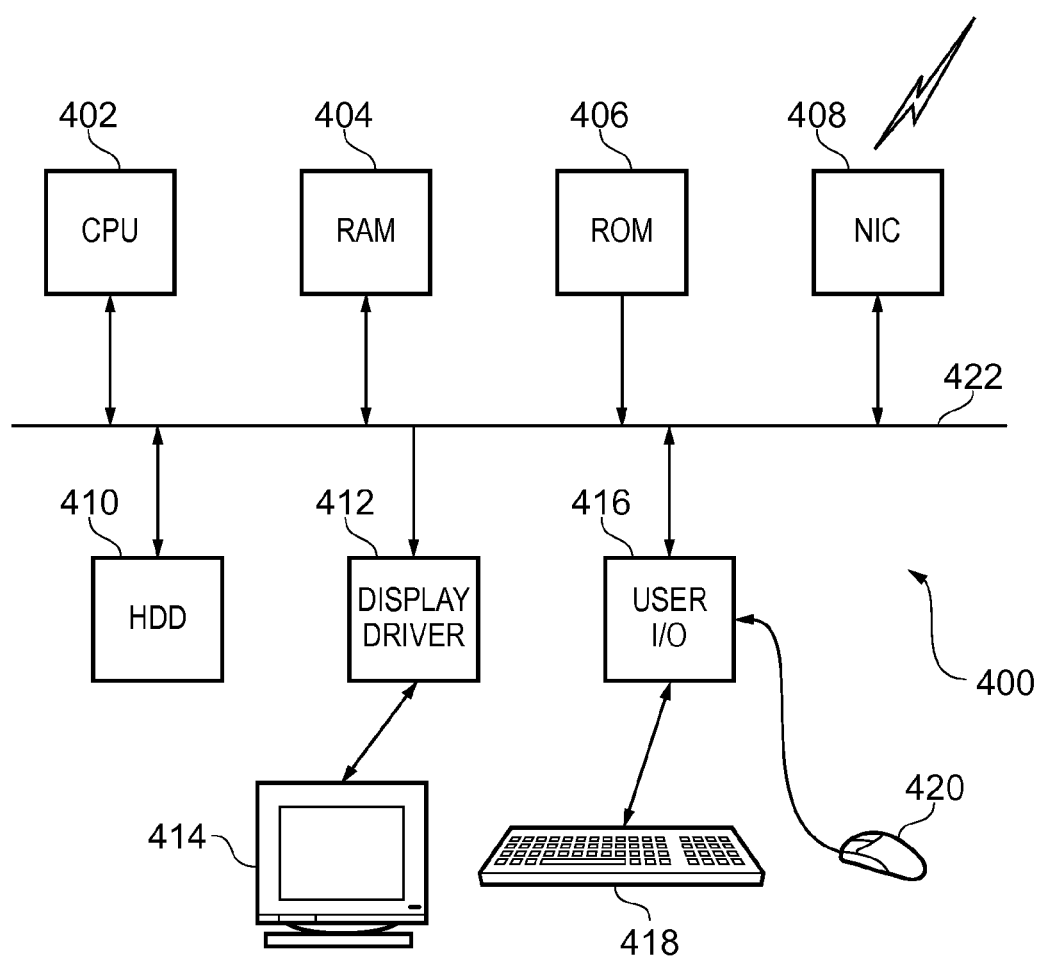
FIG. 15 illustrates an example of a computing device which can be used to execute the memory compiler.

FIG. 15 schematically illustrates a general purpose computer 400 of the type that may be used to implement the above described memory compilation operation in order to generate a memory instance. The general purpose computer 400 includes a central processing unit 402, a random access memory 404, a read only memory 406, a network interface card 408, a hard disk drive 410, a display driver 412 and monitor 414 and a user input/output circuit 416 with a keyboard 418 and mouse 420 all connected via a common bus 422. In operation the central processing unit 402 will execute computer program instructions that may be stored in one or more of the random access memory 404, the read only memory 406 and the hard disk drive 410 or dynamically downloaded via the network interface card 408. The results of the processing performed may be displayed to a user via the display driver 412 and the monitor 414. User inputs for controlling the operation of the general purpose computer 400 may be received via the user input output circuit 416 from the keyboard 418 or the mouse 420 (and hence for example the input parameters used to determine certain properties of the required memory instance can be entered via this mechanism). It will be appreciated that the computer program could be written in a variety of different computer languages. The computer program may be stored and distributed on a recording medium or dynamically downloaded to the general purpose computer 400. When operating under control of an appropriate computer program, the general purpose computer 400 can perform the above described memory compiler operation and can be considered to form an apparatus for performing the above described memory compiler operation. The architecture of the general purpose computer 400 could vary considerably and FIG. 15 is only one example.

Some specific examples of implementations of the present technique are discussed above. However the exact details of these implementations are not essential. It will be appreciated that the present technique could be implemented in other ways.

In one example a storage device may comprise:
a plurality of storage cells to store data values;
control circuitry to simultaneously couple at least two storage cells to at least one common signal line; and
sensing circuitry to sense a signal level on at least one of said at least one common signal line which is indicative of a result of a logical operation applied to the data values stored in each of said at least two storage cells.

The inventors recognised that by simultaneously coupling at least two storage cells to a common signal line, it is possible to sense from the signal level on the common signal line a value which indicates a result of a logical operation applied to the data values stored in these cells. This means that the result of the logical operation can be obtained faster than with earlier techniques, which would have to perform two or more read accesses to read each data value, and send the read data values back to a processing circuit which would then evaluate the result of the logical operation. By calculating the result of the logical operation within the storage device, a single access can be performed to obtain the logical result, saving at least one data access to improve performance. This performance improvement will be particularly significant for higher radix operations with more than two input operands. Also, by calculating the result of the logical operation within the storage device rather than at a processing circuit, the processing circuit may be free to perform other operations which may provide a further performance improvement.

The storage device could be any storage device provided within a data processing apparatus. For example, the storage device may comprise a memory, cache or register bank. The storage cells may be arranged in rows and columns with each storage cell at the intersection of a wordline with a pair of bitlines. In general a row of storage cells may be considered to be the group of storage cells which share the same wordline and a column of storage cells may be considered to be the group of storage cells which share the same bitlines (irrespective of the physical location of those cells within an integrated circuit).

During an operation to obtain the result of the logical operation, the control circuitry may simultaneously assert at least two wordlines corresponding to selected cells. To support this, the wordline driver of the storage device may be modified to generate the wordline signals in response to two or more addresses identifying the selected cells or rows of cells (e.g. rather than a 'one hot' wordline driver which asserts a single row at a time, a driver may be provided that can assert multiple wordlines simultaneously).

The common signal line to which the at least two storage cells are coupled when performing a logical operation may be any signal line within the storage device. It is possible to provide a dedicated signal line for the purpose of outputting the results of logical operations, separate from the bitlines. For example, each storage cell could be provided with additional control transistors to selectively couple a storage cell to the common output line. This approach may be useful if it is desirable to support logical operations performed on data values stored in cells within different columns.

However, area overhead can be lower by reusing the bitlines as the common signal line. Hence, a logical operation may be applied to two or more cells within the same column by asserting wordlines to multiple rows of cells and sensing the signal levels on one or both of the bitlines in the selected column. With this approach there is no need for additional control transistors or signal lines other than those already provided for regular read/write operations. While this restricts the cells whose bit values can be combined in the logical operation to cells within the same column, a relatively common use of logical operations is to perform a bitwise logical operation on two or more of data words, with each bit of the result being generated by applying a logical operation to bits at corresponding positions within each data word. If data words are stored row-wise within cells in the same row, then the bits to be combined to generate each result bit may be the bits within the same column, so in practice restricting the logical operation to bit values stored in the same column would not often be a problem. On the rare occasions when a logical operation is required which combines bits in different columns to be combined, then the bit values could still be read out with a read operation and sent to a processing circuit for performing the logical operation.

To support the logical operations, the sensing circuitry may be provided with a single-ended sensing mode for sensing an absolute signal level of at least one of the pair of bitlines. It is possible to provide sensing circuitry which always operates in the single ended sensing mode, but to improve read performance, it is useful to also provide a differential sensing mode for sensing the difference between signal levels on the pair of bitlines, because a differential sensing mode is usually faster than the single sensing mode. Hence, the sensing circuitry (e.g. sense amplifiers) may be configurable to select the single-ended sensing mode when performing logical operations or the differential sensing mode when performing read operations.

In one example, the sensing circuitry may have two pairs of cross-coupled inverters each having a first inverter and a second inverter. In the differential sensing mode each pair of cross-coupled inverters may have the input of the first inverter coupled to a first bitline and the input of the second inverter coupled to a second bitline. Hence in the differential sensing mode each pair of cross coupled inverters responds to changes in signal level on either of the pair of bitlines, and when one of the bitlines changes states then each pair of cross coupled inverters reinforces this change to more quickly pull that bitline to the opposite signal level. This speeds up read operations allowing faster read cycles and hence improved performance. In the single-ended sensing mode, one pair of cross coupled inverters may have the input of the first inverter coupled to the first bitline and the input of the second inverter coupled to a reference signal level, and the other pair may have the input of the first inverter coupled to the reference signal level and the input of the second inverter coupled to the second bitline. Hence in the single-ended sensing mode each pair of cross coupled inverters independently senses the signal level on a different bitline by comparing it with the reference signal level. Regardless of the current mode of the sensing circuitry, the state of each bitline can be determined from the states of the pairs of cross coupled inverters.

It may seem counter-intuitive to allow the control circuitry to simultaneously couple at least two storage cells to a common signal line, in order to generate the result of the logical operation within the storage device as discussed above. One might expect that this is undesirable because when two or more storage cells are coupled to a common signal line, it is possible that the state of one storage cell may cause the state of the other cell to be disturbed. However, by providing protection circuitry for protecting the data values in the at least two cells from disturbance, this problem can be avoided. For example, the protection circuitry may be implemented using any read disturb avoidance technique. For example, when asserting the wordlines during the logical operation, the voltage on the wordlines may be lower than a supply voltage for the at least two storage cells. This can be done either by lowering the wordline voltage or by raising the supply voltage for the storage cells. By providing a higher supply voltage than the voltage on the wordlines, access transistors for the cells will turn on less strongly reducing the risk of the storage cells changing state. For example, the protection circuitry may comprise part of the wordline driver which controls the voltage level on the wordlines so that it is lower during the logical operation than during a write operation, or circuitry within a power supply which provides a higher supply voltage during the logical operation than used for a write operation, or transistors or other devices within the storage cell itself which lowers the wordline voltage or adjusts the supply voltage as appropriate.

The technique discussed above may be used to implement a wide range of logical operations, for example any one or more of: AND, NAND, NOR, OR, XOR or XNOR. It is not necessary to provide all the operations. The NAND, OR and XNOR operations may be implemented by inverting the result of the AND, NOR and XOR operations respectively. If inversion capability is not provided then the NAND, OR and XNOR operations need not be supported.

For example, to perform an AND or NAND operation, after precharging the bitlines, two or more cells in a column may be simultaneously coupled to the pair of bitlines for that column, and the sensing circuitry may sense a signal level on a first bitline of the pair. The result of the AND or NAND operation may then depend on whether the signal level on the first bitline is 0 or 1. Similarly, for a NOR operation or an OR operation, the signal level on a second bitline (the opposite bitline to the one sensed for the AND or NAND operation) may be sensed, and the result of the logical operation depends on whether the signal level on the second bitline is 0 or 1. For an XOR or XNOR operation, the signal level on both bitlines may be sensed, and the result may depend on whether the signal level on both bitlines is 0.

This technique may be used for different types of memory. However, it is particularly useful for SRAM (static random access memory), where the data values are represented by the state of a latch, pair of cross coupled inverters or other bistable element. Any type of SRAM cell may be used, including cells of different numbers of transistors or layouts. However, it may be particularly area efficient to use 6T SRAM cells which comprise a pair of cross coupled inverters (4 transistors) and two further transistors acting as access transistors for selectively coupling the inverters to the bitlines in response to the wordline signal.

In another example, a storage device may comprise a storage device comprising:

a plurality of storage cell means for storing data values;

control means for simultaneously coupling at least two storage cells to at least one common signal line; and sensing means for sensing a signal level on at least one of said at least one common signal line which is indicative of a result of a logical operation applied to the data values stored in each of said at least two storage cells.

In a further example, a method may comprise a method comprising:

simultaneously coupling at least two storage cells of a storage device to at least one common signal line; and sensing a signal level on at least one of said at least one common signal line which is indicative of a result of a logical operation applied to data values stored in each of said at least two storage cells.

A data processing apparatus may comprise the storage device discussed herein.

In another example, a computer readable storage medium storing a memory compiler computer program for controlling a computer to generate an instance of a memory device from a memory architecture associated with the memory compiler computer program, the memory architecture specifying a definition of circuit elements and data defining rules for combining those circuit elements, such that said instance generated specifies a memory device comprising the storage device discussed above.

A memory compiler may be provided for automatically generating an instance of a memory device from a specified memory architecture. The architecture may be such that the generated memory instance supports the in-memory computation technique discussed above. For example, the architecture may include definitions of a sense amplifier supporting a single-ended sensing mode, a wordline driver for simultaneously asserting two or more wordlines, or protection circuitry for avoiding read disturbance as discussed above. The memory compiler may be provided on a non-transitory computer storage medium.

In a further example, a storage device comprises:

an array of storage cells; and control circuitry to provide control signals on a plurality of wordlines for selecting one or more rows of storage cells of the array;

wherein the storage device has a plurality of modes including:

a non-content-addressable mode supporting a read operation in which the control circuitry controls signals on said plurality of wordlines to trigger reading of a data value from a selected storage cell of said array; and a content-addressable mode supporting a search operation in which the control circuitry controls signals on said plurality of wordlines to trigger a comparison between a search key and at least one data word represented by data values stored in multiple storage cells of said array.

In this example, a storage device may be provided with an array of storage cells which can be operated in a non-content-addressable mode or a content-addressable mode as desired for a given application or device. Both modes may use the same wordlines to select cells to be read in the non-content-addressable mode, or cells to be searched in the content-addressable mode. This allows a content addressable memory (CAM) to be provided with lower area overhead, and allows a generic memory design to be used for both non-CAM and CAM purposes, avoiding the need to develop and manufacture specific CAM memory instances.

Some CAM designs use additional search and match signal lines to perform the search operation. With the storage device of the type discussed above, this is not needed. An array of SRAM cells with bitlines and wordlines can be used to implement the CAM mode. For example, simple 6T SRAM cells can be used, which provides a great area saving, firstly because 6T SRAM cells have fewer transistors than the 9T/10T cells typically used for CAM, but also because 6T cells benefit from push-rule bit cell design which presents a significant area advantage.

In the non-content-addressable mode, each cell may store a particular data value and data can be read from one or more cells within a single row. That is, data words may be stored row-wise in the non-content-addressable mode. On the other hand, in the content-addressable mode, each data word may be represented by data values in multiple rows of at least one column of storage cells. Hence, data words in the content-addressable mode may be stored column-wise within the storage device.

Sensing circuitry may be provided for sensing signals from respective columns of storage cells via a plurality of bitlines. For the content-addressable mode, the sensing circuitry may operate in a single-ended sensing mode for sensing an absolute signal level on one or more bitlines. This allows the result of the search operation to be read from the independently sensed levels on each bitline. For the non-content-addressable mode, while it would be possible to implement this using the single-ended sensing mode of the sensing circuitry, a differential sensing mode may be faster so it can be useful to provide the sensing circuitry with a configurable design supporting both the single-ended and differential sensing modes.

For example, a sense amplifier having two pairs of cross coupled inverters discussed above may be used.

Each row of cells may be provided with a first wordline and a second wordline. Hence, there are two wordlines per row, which is unusual, but useful for supporting the content-addressable mode. Each column of storage cells may have a first bitline and a second bitline. Each storage cell may have a first control device for selectively coupling the storage cell to the first bitline of the corresponding column in response to a signal provided by the control circuitry on the first wordline, and a second control device for selectively coupling the storage cell to the second bitline in response to a signal on the second wordline. Hence, the first and second wordlines may independently control whether a storage cell is connected to the first bitline and second bitline respectively. This ability to couple a storage cell to one bitline but not the other is useful for the content-addressable mode because this allows a targeted selection of which cells are coupled to the first bitline and the second bitline based on search states of the search key. On the other hand, in the read operation in the non-content-addressable mode, both the first wordline and the second wordline may be asserted for a row of storage cells including a selected storage cell to be read, so that the cell is coupled to both bitlines.

To perform the search operation, a search key may be input comprising a string of search states. Each data word to be searched comprises a string of data states. When performing a comparison, a match condition may be determined for any data word for which each data state of the data word matches a corresponding search state of the search key. For example, this may be implemented by using the first and second wordlines discussed above. Each row of storage cells may correspond to one of the search states of the search key. During the search operation, for each row the control circuitry may provide signals on the first wordline and the second wordline which are selected in dependence on the corresponding search data in the search key. Hence, depending on the search state, the corresponding row of cells is coupled the first bitline, the second bitline, or neither bitline (depending on the particular CAM mode being used). The signals read on each bitline can then be used to determine whether each cell which should be in a particular state in order to match the corresponding search state is actually in that state, and then a match indication can be generated representing whether the overall data word matches the search key.

Different types of content-addressable mode may be supported by the storage device. Some devices may support a binary content-addressable mode in which each search state and data state represents either a first state or a second state, and a data state is considered to match the corresponding search state if both represent the same one of the first and second states. In the binary content addressable mode, each data state may be represented by a data value stored in a single storage cell. A data word may be represented by the data values in storage cells within a single column of the array. Alternatively if the data word requires a greater number of bits than can be stored in single column then the data word may be stored across multiple columns. To perform the search operation, the first and second wordlines may be provided with control signals depending on each search state for the corresponding row is in the first state or the second state. The sensing circuitry may then sense signal levels on the first bitline and the second bitline for a selected column, and output a match indication if the signal levels on the first and second bitlines both exceed a predetermined threshold. Effectively, all the cells in the column which should be in the first state in order to match the search state can be connected to one bitline and the cells which should be in the second state in order to match the search state can be connected to the other bitline, and if both bitlines remain high then this indicates that all the cells match. If any of the cells is in a state different from the corresponding search state, then one of the bitlines will fall below the threshold and then a non-match indication can be output for this data word.

The content addressable mode could also be a ternary content addressable mode in which each search state and each data state represents one of a first state, a second state and a mask state. A data state may be considered to match the corresponding search state in all situations other than where the data state is the first state and the search state is the second state or where the data state is the second state and the search state is the first state. If either the search state or the data state is in the mask state then the search state matches the data state. For the ternary content addressable mode, each data state may be represented by data values stored in storage cells in the same row of two adjacent columns. Hence, a data word may comprise the data states in multiple rows of the two columns, or if the data word requires more states than there are rows within a column, by the data states represented by pairs of adjacent cells in two or more pairs of columns. As for the binary CAM mode, in the ternary CAM mode the signals on the first and second wordlines may again be asserted depending on whether the search state for that row is a first state a second state or a mask state.

In the ternary content addressable mode, it is not necessary to sense signals on all the bitlines to detect the result of the search operation. For each pair of adjacent columns, the match indication can be dependent on signal levels sensed from a first bitline in one of the columns and a second bitline in the other column, with the match indication result depending on whether the signals on both these bitlines exceed a predetermined threshold.

In the content addressable mode, a write operation may be performed in a plurality of write cycles, with each write cycle corresponding to one of the data states and writing this data state to a selection of cells within the data word. Hence, In each write cycle, signals may be provided on the wordlines for selecting the storage cells which are to be written with the data state for the current write cycle. For the binary content addressable mode there are two write cycles corresponding to the first and second states respectively, and for the ternary mode there would be three write cycles, corresponding to the first, second and mask states.

Protection circuitry may be provided to prevent read disturbance during the search operation. Any known disturb avoidance technique maybe used for this. For example, during the search operation, a voltage on the wordlines may be lower than a supply voltage for the storage cells (either by lowering the word line voltage or raising the supply voltage). During a write operation, the voltage on the wordlines and the supply voltage to the storage cells in the column being written may have a lower voltage than the supply voltage for other storage cells not being written.

Again, a memory compiler may be provided for generating an instance of a memory device, as discussed above. The memory compiler may be provided on a non-transitory computer storage medium.

In another example, a storage device comprises:
an array of storage cell means for storing data values; and
control means for providing control signals on a plurality of wordline means for selecting one or more rows of storage cell means of the array;
wherein the storage device has a plurality of modes including:

a non-content-addressable mode supporting a read operation in which the control means controls signals on said plurality of wordlines to trigger reading of a data value from a selected storage cell of said array; and a content-addressable mode supporting a search operation in which the control means controls signals on said plurality of wordlines to trigger a comparison between a search key and at least one data word represented by data values stored in multiple storage cells of said array.

In a further example, a method for a storage device comprising an array of storage cells and a plurality of wordlines for selecting one or more rows of storage cells of the array is provided, the method comprising:

selecting one of a non-content-addressable mode and a content-addressable mode of the storage device;

if the non-content-addressable mode is selected, performing a read operation in which signals on the plurality of wordlines are controlled to trigger reading of a data value from a selected storage cell of the array; and if the content-addressable mode is selected, performing a search operation in which signals on the plurality of wordlines are controlled to trigger a comparison between a search key and at least one data word represented by data values stored in multiple storage cells of said array.

In another example a storage device comprises a plurality of 6T SRAM storage cells, each storage cell comprising a first access transistor to couple the storage cell to a first bitline in response to a signal provided on a first wordline and a second access transistor to couple the storage cell to a second bitline in response to a signal provided on a second wordline different from said first wordline.

In a further example a storage device comprises an array of 6T SRAM storage cells; and control circuitry having a non-content-addressable mode supporting a read operation in which the control circuitry provides signals to trigger reading of a data value from a selected storage cell of said array, and a content-addressable mode supporting a search operation in which the control circuitry provides signals to trigger a comparison between a search key and at least one data word represented by data values stored in multiple storage cells of said array.

In the present application, the words "configured to . . . " are used to mean that an element of an apparatus has a configuration able to carry out the defined operation. In this context, a "configuration" means an arrangement or manner of interconnection of hardware or software. For example, the apparatus may have dedicated hardware which provides the defined operation, or a processor or other processing device may be programmed to perform the function. "Configured to" does not imply that the apparatus element needs to be changed in any way in order to provide the defined operation.

CLAUSES

The following numbered clauses set out some other non-limiting example arrangements:

(1) A storage device comprising:

an array of storage cells; and control circuitry to provide control signals on a plurality of wordlines for selecting one or more rows of storage cells of the array;

wherein the storage device has a plurality of modes including:

a non-content-addressable mode supporting a read operation in which the control circuitry controls signals on said plurality of wordlines to trigger reading of a data value from a selected storage cell of said array; and a content-addressable mode supporting a search operation in which the control circuitry controls signals on said plurality of wordlines to trigger a comparison between a search key and at least one data word represented by data values stored in multiple storage cells of said array.

(2) The storage device according to clause (1), wherein the storage cells comprise SRAM cells.

(3) The storage device according to clause (2), wherein the storage cells comprise 6T SRAM cells.

(4) The storage device according to any of clauses (1) to (3), wherein in the content-addressable mode, each data word is represented by data values stored in multiple rows of at least one column of storage cells.

(5) The storage device according to any of clauses (1) to (4), comprising sensing circuitry to sense signals from respective columns of storage cells via a plurality of bitlines.

(6) The storage device according to clause (5), wherein in the content-addressable mode, the sensing circuitry operates in a single-ended sensing mode for sensing an absolute signal level on one or more bitlines.

(7) The storage device according to any of clauses (5) and (6), wherein in the non-content addressable mode, the sensing circuitry operates in a differential sensing mode for sensing a difference between the signal levels on a pair of bitlines corresponding to a selected column of storage cells.

(8) The storage device according to any of clauses (1) to (7), wherein each row of storage cells is provided with a first wordline and a second wordline.

(9) The storage device according to clause (8), wherein each column of storage cells is provided with a first bitline and a second bitline; and each storage cell comprises a first control device to selectively couple the storage cell to the first bitline in response to a signal provided by the control circuitry on the first wordline, and a second control device to selectively couple the storage cell to the second bitline in response to a signal provided by the control circuitry on the second wordline.

(10) The storage device according to clause (8) or (9), wherein in the read operation in the non-content-addressable mode, the control circuitry asserts both the first wordline and the second wordline for a row of storage cells including the selected storage cell.

(11) The storage device according to any of clauses (1) to (10), wherein the search key comprises a plurality of search states, each of the at least one data word comprises a plurality of data states, and in the content-addressable mode, the comparison determines a match condition for any of said at least one data word for which each data state of the data word matches a corresponding search state of the search key.

(12) The storage device according to clause (11), wherein each row of storage cells is provided with a first wordline and a second wordline; and in the search operation performed in the content-addressable mode, for each of a plurality of rows of the array, the control circuitry is to provide signals on the first wordline and the second wordline selected in dependence on a corresponding search state of the search key.

(13) The storage device according to any of clauses (11) and (12), wherein the content-addressable mode comprises a binary content-addressable mode in which:

each search state represents one of a first state and a second state;

each data state represents one of the first state and the second state; and a data state matches the corresponding search state if both the data state and the corresponding search state represent the same state.

(14) The storage device according to clause (13), wherein in the binary content-addressable mode, each data state is represented by a data value stored in a single storage cell.

(15) The storage device according to clause (14), wherein each column of storage cells is provided with a first bitline and a second bitline, the storage device comprises sensing circuitry to sense signal levels on said first bitline and said second bitline; and in the binary content-addressable mode, for each of said at least one data word the sensing circuitry is to output a match indication if the signal levels on the first and second bitlines for the corresponding column both exceed a predetermined threshold.

(16) The storage device according to any of clauses (11) to (15), wherein the content-addressable mode comprises a ternary content-addressable mode in which:

each search state represents one of a first state, a second state and a mask state;

each data state represents one of the first state, the second state and the mask state; and a data state matches the corresponding search state unless one of the data state and the corresponding search state represents the first state and the other represents the second state.

(17) The storage device according to clause (16), wherein in the ternary content-addressable mode, each data state is represented by data values stored in storage cells in the same row of two adjacent columns.

(18) The storage device according to clause (17), wherein each column of storage cells is provided with a first bitline and a second bitline, the storage device comprises sensing circuitry to sense signal levels on said first bitline and said second bitline; and in the ternary content-addressable mode, for each of said at least one data word the sensing circuitry is to output a match indication if the signal levels on the first bitline for one of said two adjacent columns and the second bitline for another of said two adjacent columns both exceed a predetermined threshold.

(19) The storage device according to any of clauses (11) to (18), wherein the content-addressable mode also supports a write operation for writing data values to a plurality of storage cells of the array to represent a target data word;

wherein the write operation comprises a plurality of write cycles each corresponding to a different one of said data states, wherein in each write cycle the control circuitry provides signals on the plurality of wordlines for selecting the storage cells to be written with the data state corresponding to the current write cycle.

(20) The storage device according to any of clauses (1) to (19), comprising protection circuitry to protect the data values in the array of storage cells from disturbance during the search operation or a write operation in the content-addressable mode.

(21) The storage device according to any of clauses (1) to (20), wherein during the search operation in the content-addressable mode, a voltage on said plurality of wordlines is lower than a supply voltage for said plurality of storage cells.

(22) The storage device according to any of clauses (1) to (21), wherein during a write operation in the content-addressable mode, a voltage on said plurality of wordlines and a supply voltage for storage cells in a selected column of storage cells to be written are lower than a supply voltage for storage cells in other columns of the array.

(23) A data processing apparatus comprising the storage device according to any of clauses (1) to (22).

(24) A computer readable storage medium storing a memory compiler computer program for controlling a computer to generate an instance of a memory device from a memory architecture associated with the memory compiler computer program, the memory architecture specifying a definition of circuit elements and data defining rules for combining those circuit elements, such that said instance generated specifies a memory device comprising the storage device of any of clauses (1) to (22).

(25) A storage device comprising:

an array of storage cell means for storing data values; and control means for providing control signals on a plurality of wordline means for selecting one or more rows of storage cell means of the array;

wherein the storage device has a plurality of modes including:

a non-content-addressable mode supporting a read operation in which the control means controls signals on said plurality of wordlines to trigger reading of a data value from a selected storage cell of said array; and a content-addressable mode supporting a search operation in which the control means controls signals on said plurality of wordlines to trigger a comparison between a search key and at least one data word represented by data values stored in multiple storage cells of said array.

(26) A method for a storage device comprising an array of storage cells and a plurality of wordlines for selecting one or more rows of storage cells of the array, the method comprising:

selecting one of a non-content-addressable mode and a content-addressable mode of the storage device;

if the non-content-addressable mode is selected, performing a read operation in which signals on the plurality of wordlines are controlled to trigger reading of a data value from a selected storage cell of the array; and if the content-addressable mode is selected, performing a search operation in which signals on the plurality of wordlines are controlled to trigger a comparison between a search key and at least one data word represented by data values stored in multiple storage cells of said array.

(27) A storage device comprising:

a plurality of 6T SRAM storage cells, each storage cell comprising a first access transistor to couple the storage cell to a first bitline in response to a signal provided on a first wordline and a second access transistor to couple the storage cell to a second bitline in response to a signal provided on a second wordline different from said first wordline.

(28) A storage device comprising:

an array of 6T SRAM storage cells; and control circuitry having a non-content-addressable mode supporting a read operation in which the control circuitry provides signals to trigger reading of a data value from a selected storage cell of said array, and a content-addressable mode supporting a search operation in which the control circuitry provides signals to trigger a comparison between a search key and at least one data word represented by data values stored in multiple storage cells of said array.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

We claim:

1. A storage device comprising:

a plurality of storage cells to store data values;

control circuitry to simultaneously couple at least two storage cells of the plurality of storage cells to at least one common signal line, wherein the at least two storage cells comprise storage cells within a same column, and the at least one common signal line comprises a pair of bitlines corresponding to the same column; and sensing circuitry to sense a signal level on at least one of said at least one common signal line which is indicative of a result of a logical operation applied to the data values stored in each of said at least two storage cells.

2. The storage device according to claim 1, wherein the plurality of storage cells are arranged in rows and columns, wherein each storage cell of the plurality of storage cells is disposed at the intersection of a wordline with a pair of bitlines, and wherein the plurality of storage cells in the same row share the same wordline and the plurality of storage cells in the same column share the same pair of bitlines.

3. The storage device according to claim 1, wherein in an operation to obtain said result of the logical operation, the control circuitry is to simultaneously assert at least two wordlines corresponding to said at least two storage cells.

4. The storage device according to claim 1, wherein the sensing circuitry has a single-ended sensing mode for sensing an absolute signal level of at least one of the pair of bitlines.

5. The storage device according to claim 4, wherein the sensing circuitry also has a differential sensing mode for sensing a difference between the signal levels of the pair of bitlines.

6. The storage device according to claim 5, comprising mode selection circuitry to select the differential sensing mode when performing a read operation to read the data value stored in one of said storage cells, and to select the single-ended sensing mode when performing an operation to determine said result of said logical operation.

7. The storage device according to claim 5, wherein the sensing circuitry comprises two pairs of cross-coupled inverters each comprising a first inverter and a second inverter;
  in the differential sensing mode, each pair of cross-coupled inverters has the input of the first inverter coupled to a first bitline of the pair of bitlines and an input of the second inverter coupled to a second bitline of the pair of bitlines; and
  in the single-ended sensing mode, one pair of cross-coupled inverters has the input of the first inverter coupled to the first bitline and an input of the second inverter coupled to a reference signal level, and the other pair of cross-coupled inverters has the input of the first inverter coupled to the reference signal level and an input of the second inverter coupled to the second bitline.

8. The storage device according to claim 1, comprising protection circuitry to protect the data values in said at least two storage cells from disturbance when coupled to said at least one common signal line.

9. The storage device according to claim 3, wherein when asserting said at least two wordlines, a voltage on said at least two wordlines is lower than a supply voltage for said at least two storage cells.

10. The storage device according to claim 1, wherein said logical operation comprises at least one of:
  AND;
  NAND;
  NOR;
  OR;
  XOR; and
  XNOR.

11. The storage device according to claim 1, wherein if said logical operation comprises an AND or NAND operation, then said sensing circuitry is to sense the signal level on a first bitline of said pair of bitlines of the at least one common signal line, and the result of said logical operation is indicated by whether the signal level on said first bitline is 0 or 1.

12. The storage device according to claim 1, wherein if said logical operation comprises a NOR or OR operation, then said sensing circuitry is to sense the signal level on a second bitline of said pair of bitlines of the at least one common signal line, and the result of said logical operation is indicated by whether the signal level on said second bitline is 0 or 1.

13. The storage device according to claim 1, wherein if said logical operation comprises an XOR or XNOR operation, then said sensing circuitry is to sense the signal level on both bitlines of said pair of bitlines of the at least one common signal line, and the result of said logical operation is dependent on whether the signal level on both bitlines is 0.

14. The storage device according to claim 1, wherein the plurality of storage cells comprise SRAM cells.

15. The storage device according to claim 1, wherein the plurality of storage cells comprise 6T SRAM cells.

16. A data processing apparatus comprising the storage device according to claim 1.

17. A storage device comprising:
  a plurality of storage cell means for storing data values;
  control means for simultaneously coupling at least two storage cells to at least one common signal line; and
  sensing means for sensing a signal level on at least one of said at least one common signal line which is indicative of a result of a logical operation applied to the data values stored in each of said at least two storage cells,
  wherein in an operation to obtain the result of the logical operation, the control means simultaneously asserts at least two wordlines corresponding to the at least two storage cells, and
  wherein when asserting the at least two wordlines, a voltage on the at least two wordlines is lower than a supply voltage for the at least two storage cells.

18. A method comprising:
  simultaneously coupling at least two storage cells of a storage device to at least one common signal line, wherein the at least two storage cells comprise storage cells within a same column, and the at least one common signal line comprises a pair of bitlines corresponding to the same column; and
  sensing a signal level on at least one of said at least one common signal line which is indicative of a result of a logical operation applied to data values stored in each of said at least two storage cells.

19. A computer readable storage medium storing a memory compiler computer program for controlling a computer to generate an instance of a memory device from a memory architecture associated with the memory compiler computer program, the memory architecture specifying a definition of circuit elements and data defining rules for combining those circuit elements, such that said instance generated specifies a memory device comprising the storage device of claim 1.

* * * * *